(12) United States Patent
Larson, III et al.

(10) Patent No.: US 7,388,455 B2
(45) Date of Patent: Jun. 17, 2008

(54) FILM ACOUSTICALLY-COUPLED TRANSFORMER WITH INCREASED COMMON MODE REJECTION

(75) Inventors: John D. Larson, III, Palo Alto, CA (US); Naghmeh Sarkeshik, Cupertino, CA (US); Stephen L. Ellis, Pleasanton, CA (US)

(73) Assignee: Avago Technologies Wireless IP Pte Ltd, Singapore (SG)

( * ) Notice: Subject to any disclaimer, the term of this patent is extended or adjusted under 35 U.S.C. 154(b) by 82 days.

(21) Appl. No.: 10/965,586

(22) Filed: Oct. 13, 2004

(65) Prior Publication Data
US 2005/0093659 A1     May 5, 2005

Related U.S. Application Data

(63) Continuation-in-part of application No. 10/699,481, filed on Oct. 30, 2003, now Pat. No. 6,946,928.

(51) Int. Cl.
*H03H 9/54* (2006.01)
*H03H 9/60* (2006.01)

(52) U.S. Cl. .................. 333/189; 333/192; 333/32; 333/25

(58) Field of Classification Search ......... 333/187–189, 333/133
See application file for complete search history.

(56) References Cited

U.S. PATENT DOCUMENTS

| 3,174,122 A | 3/1965 | Fowler et al. |
|---|---|---|
| 3,189,851 A | 6/1965 | Fowler |
| 3,321,648 A | 5/1967 | Kolm |
| 3,422,371 A | 1/1969 | Poirier et al. |
| 3,568,108 A | 3/1971 | Poirier et al. |
| 3,582,839 A | 6/1971 | Pim et al. |
| 3,590,287 A | 6/1971 | Berlincourt et al. |
| 3,610,969 A | 10/1971 | Clawson et al. |

(Continued)

FOREIGN PATENT DOCUMENTS

DE      101 60 617      12/2001

(Continued)

OTHER PUBLICATIONS

Lakin K.M., "Bulk Acoustic Wave Coupled Resonator Filters", IEEE International Frequency Control Symposium and PDA Exhibition, 2002, pp. 8-14, May 29-31, 2002.

(Continued)

*Primary Examiner*—Barbara Summons

(57) ABSTRACT

The film acoustically-coupled transformer (FACT) has a first and second decoupled stacked bulk acoustic resonators (DSBARs). Each DSBAR has a lower film bulk acoustic resonator (FBAR), an upper FBAR atop the lower FBAR, and an acoustic decoupler between them FBARs. Each FBAR has opposed planar electrodes and a piezoelectric element between the electrodes. A first electrical circuit interconnects the lowers FBAR of the first DSBAR and the second DSBAR. A second electrical circuit interconnects the upper FBARs of the first DSBAR and the second DSBAR. In at least one of the DSBARs, the acoustic decoupler and one electrode of the each of the lower FBAR and the upper FBAR adjacent the acoustic decoupler constitute a parasitic capacitor. The FACT additionally has an inductor electrically connected in parallel with the parasitic capacitor. The inductor increases the common-mode rejection ratio of the FACT.

22 Claims, 19 Drawing Sheets

U.S. PATENT DOCUMENTS

| | | | |
|---|---|---|---|
| 3,826,931 A | 7/1974 | Hammond | |
| 3,845,402 A | 10/1974 | Nupp | |
| 4,084,217 A | 4/1978 | Brandis et al. | |
| 4,172,277 A | 10/1979 | Pinson | |
| 4,272,742 A | 6/1981 | Lewis | |
| 4,281,299 A | 7/1981 | Newbold | |
| 4,320,365 A | 3/1982 | Black et al. | |
| 4,355,408 A | 10/1982 | Scarrott | |
| 4,456,850 A | 6/1984 | Inoue et al. | 310/324 |
| 4,529,904 A | 7/1985 | Hattersley | |
| 4,625,138 A | 11/1986 | Ballato | |
| 4,719,383 A | 1/1988 | Wang et al. | |
| 4,798,990 A | 1/1989 | Henoch | |
| 4,836,882 A | 6/1989 | Ballato | |
| 4,841,429 A | 6/1989 | Mcclanahan et al. | |
| 4,906,840 A | 3/1990 | Zdeblick et al. | |
| 5,048,036 A | 9/1991 | Scifres et al. | |
| 5,048,038 A | 9/1991 | Brennan et al. | |
| 5,118,982 A | 6/1992 | Inoue et al. | |
| 5,129,132 A | 7/1992 | Zdeblick et al. | |
| 5,162,691 A | 11/1992 | Mariani et al. | |
| 5,241,209 A | 8/1993 | Sasaki | |
| 5,241,456 A | 8/1993 | Marcinkiewicz et al. | |
| 5,294,898 A | 3/1994 | Dworsky et al. | |
| 5,382,930 A | 1/1995 | Stokes et al. | |
| 5,384,808 A | 1/1995 | Van Brunt et al. | |
| 5,448,014 A | 9/1995 | Kong et al. | |
| 5,465,725 A | 11/1995 | Seyed-Bolorforosh | |
| 5,587,620 A | 12/1996 | Ruby et al. | 310/346 |
| 5,589,858 A | 12/1996 | Kadowaki et al. | |
| 5,594,705 A | 1/1997 | Connor et al. | |
| 5,671,242 A | 9/1997 | Takiguchi et al. | |
| 5,692,279 A | 12/1997 | Mang et al. | |
| 5,714,917 A | 2/1998 | Ella | |
| 5,853,601 A | 12/1998 | Krishaswamy et al. | |
| 5,864,261 A | 1/1999 | Weber | 333/187 |
| 5,872,493 A | 2/1999 | Ella | |
| 5,873,153 A | 2/1999 | Ruby et al. | |
| 5,873,154 A | 2/1999 | Ylilammi et al. | |
| 5,910,756 A | 6/1999 | Ella | |
| 5,936,150 A | 8/1999 | Kobrin et al. | |
| 5,953,479 A | 9/1999 | Zhou et al. | |
| 5,982,297 A | 11/1999 | Welle | |
| 6,040,962 A | 3/2000 | Kanazawa | |
| 6,060,818 A | 5/2000 | Ruby et al. | |
| 6,087,198 A | 7/2000 | Panasik | |
| 6,107,721 A | 8/2000 | Lakin | 310/321 |
| 6,111,480 A | 8/2000 | Iyama et al. | |
| 6,124,756 A | 9/2000 | Yaklin et al. | |
| 6,150,703 A | 11/2000 | Cushman et al. | |
| 6,187,513 B1 | 2/2001 | Katakura | |
| 6,215,375 B1 | 4/2001 | Larson, III et al. | 333/187 |
| 6,228,675 B1 | 5/2001 | Ruby et al. | |
| 6,229,247 B1 | 5/2001 | Bishop | |
| 6,252,229 B1 | 6/2001 | Hays et al. | |
| 6,262,600 B1 | 7/2001 | Haigh et al. | |
| 6,262,637 B1 | 7/2001 | Bradley et al. | 333/133 |
| 6,265,246 B1 | 7/2001 | Ruby et al. | |
| 6,278,342 B1 | 8/2001 | Ella | |
| 6,292,336 B1 | 9/2001 | Horng | |
| 3,607,761 A1 | 10/2001 | Nakagawa | |
| 6,307,447 B1 | 10/2001 | Barber et al. | |
| 6,376,280 B1 | 4/2002 | Ruby et al. | |
| 6,377,137 B1 | 4/2002 | Ruby | |
| 6,384,697 B1 | 5/2002 | Ruby | |
| 6,407,649 B1 | 6/2002 | Tikka et al. | |
| 6,414,569 B1 | 7/2002 | Nakafuku | |
| 6,420,820 B1 | 7/2002 | Larson | |
| 6,424,237 B1 | 7/2002 | Ruby et al. | |
| 6,429,511 B2 | 8/2002 | Ruby et al. | |
| 6,434,030 B1 | 8/2002 | Rehm et al. | |
| 6,437,482 B1 | 8/2002 | Shibata | |
| 6,441,539 B1 | 8/2002 | Kitamura et al. | |
| 6,462,631 B2 | 10/2002 | Bradley et al. | |
| 6,466,105 B1 | 10/2002 | Lobl et al. | |
| 6,466,418 B1 | 10/2002 | Horng | |
| 6,469,597 B2 | 10/2002 | Ruby et al. | |
| 6,472,954 B1 | 10/2002 | Ruby et al. | |
| 6,476,536 B1 | 11/2002 | Pensala | |
| 6,479,320 B1 | 11/2002 | Gooch | |
| 6,483,229 B2 | 11/2002 | Ylilammi et al. | |
| 6,486,751 B1 | 11/2002 | Barber et al. | |
| 6,489,688 B1 | 12/2002 | Baumann et al. | |
| 6,492,883 B2 | 12/2002 | Liang et al. | |
| 6,507,983 B1 | 1/2003 | Ruby et al. | |
| 6,515,558 B1 | 2/2003 | Ylilammi | |
| 6,518,860 B2 | 2/2003 | Ella et al. | |
| 6,525,996 B1 | 2/2003 | Miyazawa | |
| 6,530,515 B1 | 3/2003 | Glenn et al. | |
| 6,534,900 B2 | 3/2003 | Aigner et al. | |
| 6,542,055 B1 | 4/2003 | Frank et al. | |
| 6,548,942 B1 | 4/2003 | Panasik | |
| 6,550,664 B2 | 4/2003 | Bradley et al. | |
| 6,564,448 B1 | 5/2003 | Oura et al. | |
| 6,566,979 B2 | 5/2003 | Larson et al. | |
| 6,583,374 B2 | 6/2003 | Knieser et al. | |
| 6,583,688 B2 | 6/2003 | Klee et al. | |
| 6,593,870 B2 | 7/2003 | Dummermuth et al. | |
| 6,600,390 B2 | 7/2003 | Frank | |
| 6,601,276 B2 | 8/2003 | Barber | |
| 6,617,249 B2 | 9/2003 | Ruby et al. | |
| 6,617,750 B2 | 9/2003 | Dummermuth et al. | |
| 6,630,753 B2 | 10/2003 | Malik et al. | |
| 6,635,509 B1 | 10/2003 | Ouellet | |
| 6,639,872 B1 | 10/2003 | Rein | |
| 6,651,488 B2 | 11/2003 | Larson et al. | |
| 6,657,363 B1 | 12/2003 | Aigner | |
| 6,668,618 B2 | 12/2003 | Larson et al. | |
| 6,670,866 B2 | 12/2003 | Ellaet et al. | 333/133 |
| 6,693,500 B2 | 2/2004 | Yang et al. | |
| 6,710,508 B2 | 3/2004 | Ruby et al. | |
| 6,710,681 B2 | 3/2004 | Figueredo et al. | |
| 6,714,102 B2 | 3/2004 | Ruby et al. | |
| 6,720,844 B1 | 4/2004 | Lakin | |
| 6,720,846 B2 | 4/2004 | Iwashita et al. | |
| 6,724,266 B2 | 4/2004 | Piazza et al. | |
| 6,774,746 B2 | 8/2004 | Whatmore et al. | |
| 6,777,263 B1 | 8/2004 | Gan et al. | |
| 6,787,048 B2 | 9/2004 | Bradley et al. | |
| 6,788,170 B1 | 9/2004 | Kaitila et al. | |
| 6,803,835 B2 | 10/2004 | Frank | |
| 6,812,619 B1 | 11/2004 | Kaitila et al. | |
| 6,828,713 B2 | 12/2004 | Bradley et al. | |
| 6,842,088 B2 | 1/2005 | Yamada et al. | |
| 6,873,065 B2 | 3/2005 | Haigh et al. | |
| 6,873,529 B2 | 3/2005 | Ikuta et al. | |
| 6,874,211 B2 | 4/2005 | Bradley et al. | |
| 6,874,212 B2 | 4/2005 | Larson, III | |
| 6,888,424 B2 | 5/2005 | Takiguchi et al. | |
| 6,900,705 B2 * | 5/2005 | Nakamura et al. | 333/25 |
| 6,903,452 B2 | 6/2005 | Ma et al. | |
| 6,906,451 B2 | 6/2005 | Yamada et al. | |
| 6,911,708 B2 | 6/2005 | Park | |
| 6,917,261 B2 | 7/2005 | Unterberger | |
| 6,924,583 B2 | 8/2005 | Lin et al. | |
| 6,924,717 B2 | 8/2005 | Ginsburg et al. | |
| 6,927,651 B2 | 8/2005 | Larson, III et al. | |
| 6,936,928 B2 | 8/2005 | Hedler et al. | |
| 6,936,954 B2 | 8/2005 | Peczalski | |
| 6,946,928 B2 | 9/2005 | Larson, III et al. | |
| 6,954,121 B2 | 10/2005 | Bradley et al. | |
| 6,963,257 B2 | 11/2005 | Ella et al. | |
| 6,975,183 B2 | 12/2005 | Aigner et al. | |
| 6,977,563 B2 | 12/2005 | Komuro et al. | |

| | | | | | |
|---|---|---|---|---|---|
| 6,985,052 B2 | 1/2006 | Tikka | EP | 0865157 | 9/1998 |
| 6,987,433 B2 | 1/2006 | Larson et al. | EP | 1 047 189 | 4/1999 |
| 6,989,723 B2 | 1/2006 | Komuro et al. | EP | 0973256 | 1/2000 |
| 6,998,940 B2 | 2/2006 | Metzger | EP | 1 100196 | 5/2001 |
| 7,019,604 B2 | 3/2006 | Gotoh et al. | EP | 1096259 | 5/2001 |
| 7,019,605 B2 | 3/2006 | Larson, III | EP | 1258990 | 11/2002 |
| 7,057,476 B2 | 6/2006 | Hwu | EP | 1180494 | 3/2003 |
| 7,091,649 B2 | 8/2006 | Larson et al. | EP | 1 542 362 | 6/2003 |
| 7,098,758 B2 | 8/2006 | Wang et al. | EP | 1 557 945 | 10/2003 |
| 7,170,215 B2 | 1/2007 | Namba et al. | EP | 1258989 | 1/2004 |
| 7,187,254 B2 | 3/2007 | Su et al. | EP | 1528674 | 6/2004 |
| 2002/0000646 A1 | 1/2002 | Gooch et al. | EP | 1528675 | 6/2004 |
| 2002/0030424 A1 | 3/2002 | Iwata | EP | 1528677 | 7/2004 |
| 2002/0121944 A1 | 9/2002 | Larson, III et al. | EP | 1 517 444 | 8/2004 |
| 2002/0121945 A1 | 9/2002 | Ruby et al. | EP | 1249932 | 3/2005 |
| 2002/0152803 A1 | 10/2002 | Larson, III et al. | EP | 1517443 | 3/2005 |
| 2002/0190814 A1 | 12/2002 | Yamada et al. | EP | 1575165 | 9/2005 |
| 2003/0001251 A1 | 1/2003 | Cheever et al. | GB | 1207974 | 11/1967 |
| 2003/0006502 A1 | 1/2003 | Karpman | GB | 2411239 | 8/2005 |
| 2003/0087469 A1 | 5/2003 | Ma | GB | 2418791 | 4/2006 |
| 2003/0102776 A1 | 6/2003 | Takeda et al. | JP | 2002-217676 | 8/2002 |
| 2003/0111439 A1 | 6/2003 | Fetter et al. | WO | WO 98/16957 | 4/1998 |
| 2003/0128081 A1 | 7/2003 | Ella et al. ............... 333/133 | WO | WO-9816957 | 4/1998 |
| 2003/0132493 A1 | 7/2003 | Kang et al. | WO | WO-01/06647 | 1/2001 |
| 2003/0141946 A1 | 7/2003 | Ruby et al. | WO | WO-01/99276 | 12/2001 |
| 2003/0179053 A1 | 9/2003 | Aigner et al. | WO | WO-02/103900 | 12/2002 |
| 2004/0092234 A1 | 5/2004 | Phojonen | WO | WO 03/030358 | 4/2003 |
| 2004/0124952 A1 | 7/2004 | Tikka | WO | WO-03/043188 | 5/2003 |
| 2004/0150293 A1 | 8/2004 | Unterberger | WO | WO 03/050950 | 6/2003 |
| 2004/0150296 A1 | 8/2004 | Park et al. | WO | WO 03/058809 | 7/2003 |
| 2004/0195937 A1 | 10/2004 | Matsubara et al. | WO | WO 2004/034579 | 4/2004 |
| 2004/0257172 A1 | 12/2004 | Schmidhammer et al. | WO | WO-2004/051744 | 6/2004 |
| 2004/0263287 A1 | 12/2004 | Ginsburg et al. | WO | WO-2005/043752 | 5/2005 |
| 2005/0023931 A1 | 2/2005 | Bouche et al. | WO | WO-2005/043753 | 5/2005 |
| 2005/0030126 A1 | 2/2005 | Inoue et al. | WO | WO-2005/043756 | 5/2005 |
| 2005/0036604 A1 | 2/2005 | Scott et al. | | | |
| 2005/0057117 A1 | 3/2005 | Nakatsuka et al. | | | |
| 2005/0057324 A1 | 3/2005 | Onishi et al. | | | |
| 2005/0068124 A1 | 3/2005 | Stoemmer | | | |
| 2005/0093396 A1 | 5/2005 | Larson et al. | | | |
| 2005/0093653 A1 | 5/2005 | Larson, III | | | |
| 2005/0093654 A1 | 5/2005 | Larson et al. | | | |
| 2005/0093655 A1 | 5/2005 | Larson et al. | | | |
| 2005/0093657 A1 | 5/2005 | Larson et al. | | | |
| 2005/0093658 A1 | 5/2005 | Larson et al. | | | |
| 2005/0093659 A1 | 5/2005 | Larson et al. | | | |
| 2005/0104690 A1 | 5/2005 | Larson et al. | | | |
| 2005/0110598 A1 | 5/2005 | Larson, III | | | |
| 2005/0128030 A1 | 6/2005 | Larson et al. | | | |
| 2005/0140466 A1 | 6/2005 | Larson, III et al. | | | |
| 2005/0167795 A1 | 8/2005 | Higashi | | | |
| 2005/0193507 A1 | 9/2005 | Ludwiczak | | | |
| 2005/0206271 A1 | 9/2005 | Higuchi et al. | | | |
| 2005/0012570 A1 | 10/2005 | Korden et al. | | | |
| 2005/0218488 A1 | 10/2005 | Mie | | | |
| 2006/0087199 A1 | 4/2006 | Larson et al. | | | |
| 2006/0103492 A1 | 5/2006 | Feng et al. | | | |
| 2006/0132262 A1 | 6/2006 | Fazzlo et al. | | | |
| 2006/0164163 A1 | 7/2006 | Tikka | | | |
| 2006/0185139 A1 | 8/2006 | Larson, III et al. | | | |
| 2007/0084964 A1 | 4/2007 | John et al. | | | |
| 2007/0085447 A1 | 4/2007 | Larson | | | |
| 2007/0085631 A1 | 4/2007 | Larson et al. | | | |
| 2007/0085632 A1 | 4/2007 | Larson et al. | | | |
| 2007/0086080 A1 | 4/2007 | Larson et al. | | | |
| 2007/0086274 A1 | 4/2007 | Nishimura et al. | | | |
| 2007/0090892 A1 | 4/2007 | Larson | | | |
| 2007/0170815 A1 | 7/2007 | Unkrich | | | |
| 2007/0171002 A1 | 7/2007 | Unkrich | | | |

FOREIGN PATENT DOCUMENTS

EP       0 880 227       5/1998

OTHER PUBLICATIONS

Examination Report dated Aug. 25, 2006 from corresponding application No. GB 0605770.7.

Examination report from corresponding application No. GB0605775.6 dated Aug. 30, 2006.

B. Hadimioglu et al., "Polymer Films As Acoustic Matching Layers", 1990 IEEE Ultrasonics Symposium Processdings, vol. 3 pp. 1337-1340, Dec. 1990.

Jung, Jun-Phil, "Experimental and Theoretical INvestigation on the Relationship between AlN Properties and AlN-based FBAR Characterisitics", IEEE Internations Frequency Control Symposium, May 4, 2003, pp. 779-784.

Lobl, H.P., et al., "Piezoelectric Material for BAW Resonators and Filters", IEEE Ultrasonics Symposium Oct. 5, 2003, pp. 807-811.

"Design of Coupled Responator Filters Using Admittance And Scattering Matrices", 2003 IEEE Ultrasonics Symposium Oct. 5, 2003, pp. 1428-1431.

Yang, C.-M., Highly C-Axis-Oriented AlN Film Using MOCVD for 5GHz-Band FBAR Filter, IEEE Ultrasonics Symposium, Oct. 5, 2003, 99. 170-173.

Krishnaswamy, S.A., et al., "Film Bulk Acoustic Wave Resonator Technology", Ultr Symposium, Dec. 1990, vol. 1, pp. 529-536.

Examination Report from corresponding application number GB0605971.1 dated Aug. 24, 2006.

Examination Report from corresponding application number GB0605779.8 dated Aug. 23, 2006.

Martin, et al., "Development of Low-Dielectric Contsant Polymer for Fabrication of Integrate4d Circuit Interconnect", 12 Advanced Materials, pp. 1769-1778, No. 23, Dec. 1, 2000.

Lakin, K.M. et al., "High Performance Stacked Crystal Filters for GPS and Wide Bandwidth Applications", 2001 IEEE Ultrasonics Symposium, (Jan. 1, 2001), 833-838.

Holzlohner, Ronald et al., "Accurate Claculation of Eye Diagrams and Bit Error Rates in Optical Transmission Systems Using Linearization", Journal of Lightwave Technology, vol. 20, No. 3, (Mar. 2002), pp. 389-400.

Lankin, K.M. "Coupled Resonator Filters". 2002 IEEE Ultrasonics Symposium, (Mar. 3, 2002), 901-908.

"Search report from corresponding application No.", GB0620152.9, (Nov. 15, 2006).

"Search report from corresponding application No.", GB0620655.1, (Nov. 17, 2006).

"Search report from corresponding application No.", GB0620653.6, (Nov. 17, 2006).

"Search report from corresponding application No.", GB0620657.7, (Nov. 23, 2006).

Coombs, Clyde F., et al., "Electronic Instrument Handbook", *Second Edition, McGraw-Hill, Inc.*, (1995), pp. 5.1 to 5.29.

U.S. Appl. No. 10/971,169, filed OCt. 22, 2004, Larson, III et al.

"GB Search Report for", Application No. GB0522393.8, (Jan. 9, 2006), 4 pages.

"GB Search Report for Application No.", GB0525884.3, (Feb. 2, 2006), 4 pgs.

Auld, B. A., "Acoustic Resonators", *Acoustic Fields and Waves in Solids*, Second Edition, vol. II, (1990), 250-259.

"British Search Report Application No.", 0605222.9, (Jul. 11, 2006).

Tiersten, H. F., et al., "An Analysis of Thiskness-Extensional Trapped Energy Resonant Device Structures with Rectangular Electrodes in the Piezoeletric Thin Film on Solicon Configuration", *J. Appl. Phys.* 54 (10), (Oct. 1983), 5893-5910.

"Search Report from corresponding application", No. GB0605225.2, (Jun. 26, 2006).

"Search Report for Great Britain Patent Application", No. 0617742.2, (Mar. 29, 2007).

"Search Report for Great Britain Patent Application", No. 0617742.2, (Dec. 13, 2006).

"Search Report in the Great Britian Patent Application", No. 0619698.4, (Nov. 30, 2006).

Ruby, R. et al., "The Effect of Perimeter Geometry on FBAR Resonator Electrical Performance", *Microwave Symposium Digest*, 2005 IEEE MTT-S International, (Jun. 12, 2005), 217-221.

Schuessler, Hans H., "Ceramic Filters and Resonators", *Reprinted from IEEE Trans. Sonics Ultrason.*, vol. SU-21, (Oct. 1974), 257-268.

Fattinger, G. G., et al., "Coupled Bulk Acoustic Wave Resonator Filters: Key technology for single-to-balanced RF filters", 0-7803-8331-1/4/W20.00; IEEE MTT-S Digest, (2004), 927-929.

Choi, Sungjin et al., "Design of Half-Bridge Piezo-Transformer Converters in the AC Adapter Applications", *IEEE* 2005, 244-284.

Li, Yunxiu et al., "AC-DC Converter with Worldwide Range Input Voltage by Series and Parallel Piezoelectric Transformer Connection", 35th Annual IEEE Power Electronics Specialists Conference, (2004).

Ivensky, Gregory et al., "A Comparison of Piezoelectric Transformer AC/DC Converters with Current Doubler and voltage Doubler Rectifiers", *IEEE Transactions on Power Electronics*, vol. 19, No. 6., (Nov. 2004).

Navas, J. et al., "Miniaturised Battery Charger using Piezoeletric Transformers", *IEEE*, (2001), 492-496.

Jiang, Yimin et al., "A Novel Single-Phase Power Factor Correction Scheme", *IEEE*, (1993), 287-292.

\* cited by examiner

FILM ACOUSTICALLY-COUPLED TRANSFORMER WITH INCREASED COMMON MODE REJECTION

RELATED APPLICATION

This disclosure is a Continuation-in-Part of U.S. patent application Ser. No. 10/699,481 filed Oct. 30, 2003, now U.S. Pat. No. 6,946,928, of John D. Larson III and Richard Ruby. This application is also related to U.S. patent application Ser. No. 10/965,449 of John D. Larson III and Stephen Ellis entitled Pass Bandwidth Control in Decoupled Stacked Bulk Acoustic Resonator Devices and U.S. patent application Ser. No. 10/965,637 of John D. Larson III, Richard Ruby and Stephen Ellis entitled Film Acoustically-Coupled Transformer, both filed on the filing date of this disclosure. The above applications are assigned to the assignee of this application and the disclosures of the above applications are incorporated into this application by reference.

BACKGROUND

Transformers are used in many types of electronic device to perform such functions as transforming impedances, linking single-ended circuitry with balanced circuitry or vice versa and providing electrical isolation. However, not all transformers have all of these properties. For example, an autotransformer does not provide electrical isolation.

Transformers operating at audio and radio frequencies up to VHF are commonly built as coupled primary and secondary windings around a high permeability core. Current in the windings generates a magnetic flux. The core contains the magnetic flux and increases the coupling between the windings. A transformer operable in this frequency range can also be realized using an optical-coupler. An opto-coupler used in this mode is referred to in the art as an opto-isolator.

In transformers based on coupled windings or opto-couplers, the input electrical signal is converted to a different form (i.e., a magnetic flux or photons) that interacts with an appropriate transforming structure (i.e., another winding or a light detector), and is re-constituted as an electrical signal at the output. For example, an opto-coupler converts an input electrical signal to photons using a light-emitting diode. The photons pass through an optical fiber or free space that provides isolation. A photodiode illuminated by the photons generates an output electrical signal from the photon stream. The output electrical signal is a replica of the input electrical signal.

At UHF and microwave frequencies, coil-based transformers become impractical due to such factors as losses in the core, losses in the windings, capacitance between the windings, and a difficulty to make them small enough to prevent wavelength-related problems. Transformers for such frequencies are based on quarter-wavelength transmission lines, e.g., Marchand type, series input/parallel output connected lines, etc. Transformers also exist that are based on micromachined coupled coils sets and are small enough that wavelength effects are unimportant. However such transformers have issues with high insertion loss.

All the transformers just described for use at UHF and microwave frequencies have dimensions that make them less desirable for use in modern miniature, high-density applications such as cellular telephones. Such transformers also tend to be high in cost because they are not capable of being manufactured by a batch process and because they are essentially an off-chip solution. Moreover, although such transformers typically have a bandwidth that is acceptable for use in cellular telephones, they typically have an insertion loss greater than 1 dB, which is too high.

Opto-couplers are not used at UHF and microwave frequencies due to the junction capacitance of the input LED, non-linearities inherent in the photodetector, limited power handling capability and insufficient isolation to give good common mode rejection.

Above-mentioned U.S. patent application Ser. No. 10/699, 481, of which this disclosure is a continuation-in-part, discloses a film acoustically-coupled transformer (FACT) based on decoupled stacked bulk acoustic resonators (DSBARs). A DSBAR is composed of a stacked pair of film bulk acoustic resonators (FBARs) and an acoustic decoupler between the FBARs. FIG. 1A schematically illustrates an embodiment 100 of such FACT. FACT 100 has a first decoupled stacked bulk acoustic resonator (DSBAR) 106 and a second DSBAR 108 suspended above a cavity 104 in a substrate 102. DSBAR 106 has a lower FBAR 110, an upper FBAR 120 stacked on lower FBAR 110, and an acoustic coupler 130 between them, and DSBAR 108 has a lower FBAR 150, an upper FBAR 160 stacked on lower FBAR 150, and an acoustic coupler 170 between them. Each of the FBARs has opposed planar electrodes and a piezoelectric element between the electrodes. For example, FBAR 110 has opposed planar electrodes 112 and 114 with a piezoelectric element 116 between them.

FACT 100 additionally has a first electrical circuit 141 interconnecting the lower FBAR 110 of DSBAR 106 and the lower FBAR 150 of DSBAR 108 and a second electrical circuit 142 interconnecting the upper FBAR 120 of DSBAR 106 and the upper FBAR 160 of DSBAR 108.

In the embodiment of the above-described FACT shown in FIG. 1A, electrical circuit 141 connects lower FBARs 110 and 150 in anti-parallel and to terminals 143 and 144 and electrical circuit 142 connects upper FBARs 120 and 160 in series between terminals 145 and 146. In the example shown, electrical circuit 142 additionally has a center-tap terminal 147 connected to electrodes 122 and 162 of upper FBARs 120 and 160, respectively. This embodiment has a 1:4 impedance transformation ratio between electrical circuit 141 and electrical circuit 142 or a 4:1 impedance transformation ratio between electrical circuit 142 and electrical circuit 141.

In other embodiments, electrical circuit 141 electrically connects the lower FBARs 110 and 150 either in anti-parallel or in series, and electrical circuit 142 electrically connects the upper FBARs either in anti-parallel or in series.

All embodiments of the above-described FACT are small in size, are capable of linking single-ended circuitry with balanced circuitry or vice versa, and provide electrical isolation between primary and secondary. The embodiments specifically described above are also nominally electrically balanced.

The embodiment shown in FIG. 1A is of particular interest for a number of applications. However, although this embodiment is nominally electrically balanced, its common mode rejection is less than many potential applications require. The common-mode rejection of a differential device is quantified by a common-mode rejection ratio (CMRR), which is the ratio of the differential-mode voltage gain to the common-mode voltage gain of the differential device.

One approach to increasing the common-mode rejection ratio is to increase the thickness of the acoustic decoupler. However, increasing the thickness of the acoustic decoupler causes the frequency response of the FACT to exhibit spurious artifacts caused by the ability of the thicker acoustic decoupler to support more than a single acoustic mode. Such spurious response artifacts are undesirable in many applications.

What is needed, therefore, is an FACT that has the advantages of the FACT described above, but that has an increased common mode rejection ratio and a smooth frequency response.

SUMMARY OF THE INVENTION

In a first aspect, the invention provides a film acoustically-coupled transformer (FACT) that comprises a first decoupled stacked bulk acoustic resonator (DSBAR) and a second DSBAR. Each DSBAR comprises a lower film bulk acoustic resonator (FBAR), an upper FBAR stacked atop the lower FBAR, and an acoustic decoupler between the FBARs. Each FBAR comprises opposed planar electrodes and a piezoelectric element between the electrodes. The FACT additionally comprises a first electrical circuit connecting the lower FBAR of the first DSBAR to the lower FBAR of the second DSBAR and a second electrical circuit connecting the upper FBAR of the first DSBAR to the upper FBARs of the second DSBAR. In at least one of the DSBARs, the acoustic decoupler, one of the electrodes of the lower FBAR adjacent the acoustic decoupler and one of the electrodes of the upper FBAR adjacent the acoustic decoupler constitute a parasitic capacitor. The FACT additionally comprises an inductor electrically connected in parallel with the parasitic capacitor. The inductor increases the common-mode rejection ratio of the FACT.

In a second aspect, the invention provides a film acoustically-coupled transformer (FACT) having a pass band. The FACT comprises a first decoupled stacked bulk acoustic resonator (DSBAR) and a second DSBAR. Each DSBAR comprises a lower film bulk acoustic resonator (FBAR), an upper FBAR stacked atop the lower FBAR, and a piezoelectric element between the electrodes. Each FBAR comprises opposed planar electrodes and a piezoelectric element between the electrodes. The FACT additionally comprises a first electrical circuit connecting the lower FBAR of the first DSBAR to the lower FBAR of the second DSBAR, and a second electrical circuit connecting the upper FBAR of the first DSBAR to the upper FBARs of the second DSBAR. In at least one of the DSBARs, the acoustic decoupler, one of the electrodes of the lower FBAR adjacent the acoustic decoupler and one of the electrodes of the upper FBAR adjacent the acoustic decoupler constitute a parasitic capacitor. The FACT additionally comprises an element for forming, with the parasitic capacitor, a parallel resonant circuit having a resonant frequency in the pass-band of the FACT.

The inductor and the parasitic capacitor have a parallel resonance at a frequency in the pass-band of the FACT. Consequently, the path between the first and second electrical circuits has a substantially higher impedance in the pass-band than in an embodiment without the inductor. As a result, the common-mode rejection ratio is greater than in the conventional FACT that lacks the inductor.

In a final aspect, the invention provides a DSBAR device having a band-pass characteristic characterized by a center frequency. The DSBAR device comprises a lower film bulk acoustic resonator (FBAR), an upper FBAR stacked on the lower FBAR, and an acoustic decoupler between the FBARs. Each FBAR comprises opposed planar electrodes and a piezoelectric element between the electrodes. The acoustic decoupler structured to impose a phase change nominally equal to $\pi/2$ on an acoustic signal equal in frequency to the center frequency.

DETAILED DESCRIPTION

Figure 1A:
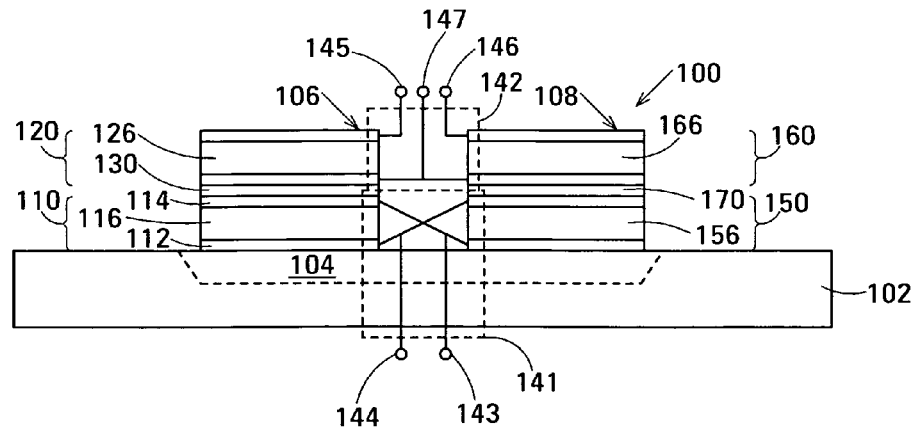
FIG. 1A is a schematic drawing of the electrical circuits of an embodiment of a 1:4 or 4:1 film acoustically-coupled transformer (FACT) in accordance with the prior art.
Figure 1B:
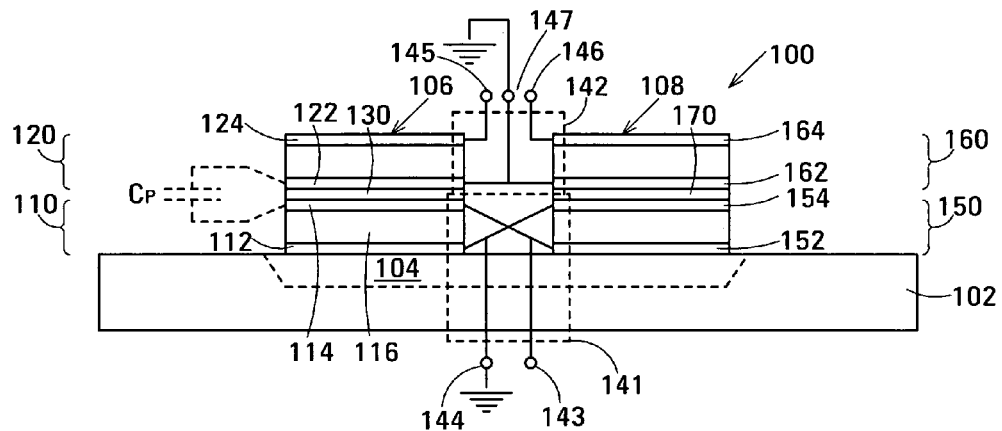
FIG. 1B is a schematic diagram showing the parasitic capacitor that exists in the FACT shown in FIG. 1A when the center tap is grounded.

The inventors have discovered that, in embodiments of film acoustically-coupled transformer (FACT) 100 described above with reference to FIG. 1A, a signal-frequency voltage difference can exist between the electrodes on opposite sides of at least one of the acoustic decouplers 130 and 170 during normal operation. FIG. 1B shows FACT 100 shown in FIG.

1A in a typical application in which terminal 144 connected to electrodes 112 and 154 is grounded and a center tap terminal 147 connected to electrodes 122 and 162 is also grounded. In this application, a signal-frequency voltage difference exists between electrodes 114 and 122 on opposite sides of acoustic decoupler 130. When applied to the parasitic capacitor $C_P$ composed of electrodes 114 and 122 and acoustic decoupler 130, this voltage difference causes a signal-frequency current to flow between electrical circuit 141 and electrical circuit 142. This current flow decreases the common mode rejection of FACT 100. A capacitor symbol labelled $C_P$ and depicted by broken lines represents the parasitic capacitor $C_P$ composed of electrodes 114 and 122 and acoustic decoupler 130. The capacitance of the parasitic capacitor is a maximum in embodiments in which the thickness of the acoustic decoupler is a minimum, i.e., the thickness of the acoustic decoupler is nominally equal to one quarter of the wavelength of an acoustic signal equal in frequency to the center frequency of the pass band of FACT 100. Such an acoustic decoupler imposes a phase change of $\pi/2$ on the acoustic signal.

In this disclosure, an element connected to a low impedance at the signal frequency instead of to ground will be regarded as being grounded.

Figure 1C:
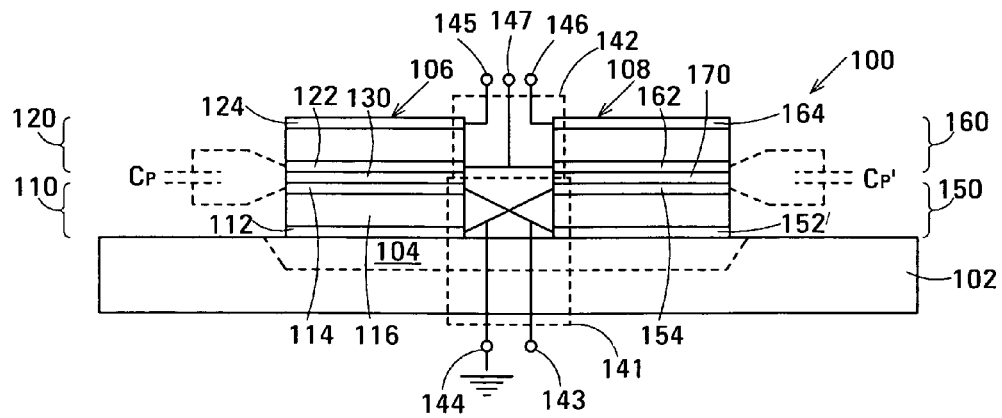
FIG. 1C is a schematic diagram showing the parasitic capacitors that exist in the FACT shown in FIG. 1A when the center tap is floating.

FIG. 1C shows FACT 100 in another exemplary application in which electrodes 112 and 154 are grounded, and electrical circuit 142 is floating. In this application, a signal-frequency voltage difference exists between electrodes 114 and 122 on opposite sides of acoustic decoupler 130, and a signal-frequency voltage difference additionally exists between electrodes 154 and 162 on opposite sides of acoustic decoupler 170. When applied to the parasitic capacitor $C_P'$ composed of electrode 154, electrode 162 and acoustic decoupler 170, this voltage difference causes an additional current to flow between electrical circuit 141 and electrical circuit 142. This current flow further impairs the common mode rejection ratio of FACT 100. A capacitor symbol labeled $C_P'$ and depicted by broken lines represents the parasitic capacitor $C_P'$ provided by electrodes 154 and 162 and acoustic decoupler 170.

Figure 2A:
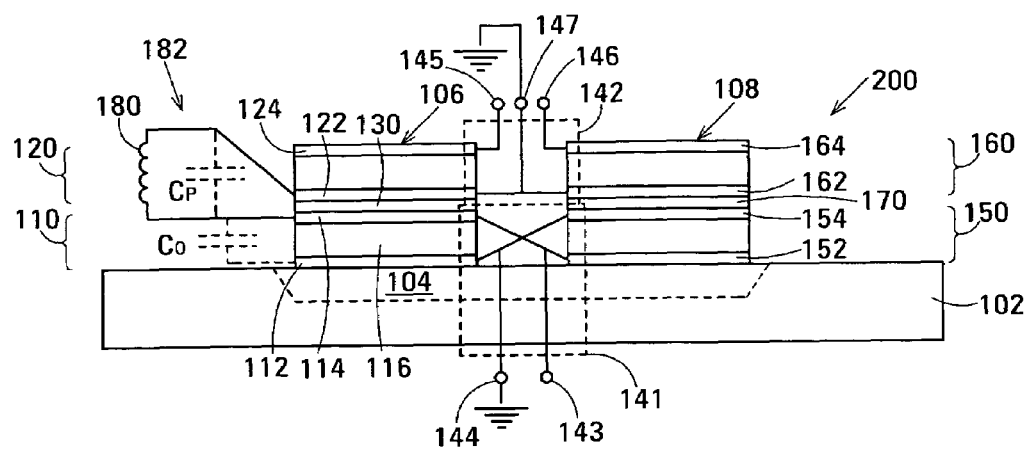
FIG. 2A is a schematic diagram of an exemplary grounded center tap embodiment of a film acoustically-coupled transformer (FACT) with high common-mode rejection ratio (CMRR) in accordance with the invention.

FIG. 2A is a schematic drawing showing an embodiment 200 of a film acoustically-coupled transformer (FACT) in accordance with the invention. FACT 200 is for use in an application similar to that described above with reference to FIG. 1B in which electrodes 112 and 154 connected to terminal 144 are grounded and electrodes 122 and 162 connected to center tap terminal 147 are also grounded. Elements of FACT 200 that correspond to elements of FACT 100 described above with reference to FIG. 1B are indicated by the same reference numerals and will not be described again here. In FACT 200, an inductor 180 is connected between electrode 114 and electrode 122 on opposite sides of acoustic decoupler 130. This connects inductor 180 in parallel with parasitic capacitor $C_P$. Inductor 180 significantly increases the common-mode rejection ratio of FACT 200 relative to that of FACT 100 by reducing the current flow between electrical circuit 141 and electrical circuit 142. Inductor 180 additionally improves the input match.

FACT 200 has a pass band. Inductor 180 and the parallel combination of parasitic capacitor $C_P$ and the capacitance $C_0$ between terminals 143 and 144 form a parallel resonant circuit 182 having a resonant frequency in the pass band. In one embodiment, the resonant frequency is equal to the center frequency of the pass band of FACT 200. The impedance of parallel resonant circuit 182 depends on a relationship between the signal frequency and the resonant frequency of the resonant circuit, and is a maximum at the resonant frequency. At signal frequencies above and below the resonant frequency, the impedance of parallel resonant circuit 182 is less than at the resonant frequency, but is substantially greater than that of parasitic capacitor $C_P$ alone at all signal frequencies in the pass band of FACT 200. Accordingly, the current that flows between electrical circuit 141 and electrical circuit 142 through parallel resonant circuit 182 is substantially less than that which would flow through parasitic capacitor $C_P$ alone. Consequently, the common-mode rejection ratio of FACT 200 is greater than that of FACT 100 shown in FIG. 1B.

Figure 2B:
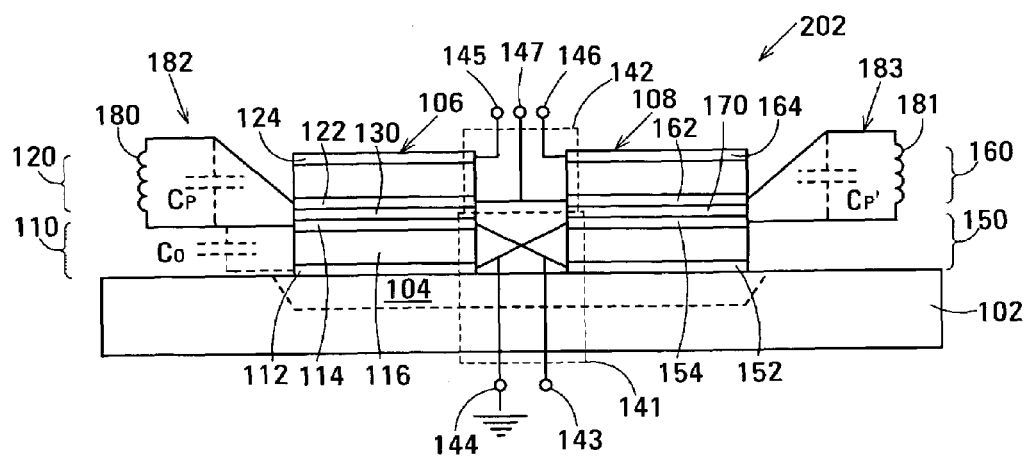
FIG. 2B is a schematic diagram of an exemplary floating center tap embodiment of a FACT with high CMRR in accordance with the invention.

FIG. 2B is a schematic drawing showing an embodiment 202 of a FACT in accordance with the invention. FACT 202 is for use in an application similar to that described above with reference to FIG. 1C in which electrodes 112 and 124 are grounded and electrical circuit 142 is floating. Elements of FACT 202 that correspond to elements of FACT 100 described above with reference to FIG. 1B and of FACT 200 described above with reference to FIG. 2A are indicated by the same reference numerals and will not be described again here. FACT 202 has an inductor 180 connected between electrode 114 and electrode 122 on opposite sides of acoustic decoupler 130 and an inductor 181 connected between electrode 154 and electrode 162 on opposite sides of acoustic decoupler 170. Inductors 180 and 181 significantly increase the common-mode rejection ratio of FACT 202 relative to that of FACT 100 by reducing the current flow between electrical circuit 141 and electrical circuit 142. Inductor 180 additionally improves the input match.

Inductor 180 and the parallel combination of parasitic capacitor $C_P$ and inter-terminal capacitance $C_0$ form a parallel resonant circuit 182 having a resonant frequency in the pass band of FACT 202. Inductor 181 and parasitic capacitor $C_P'$ form a parallel resonant circuit 183 having a resonant frequency in the pass band of FACT 202. In one embodiment, parallel resonant circuits 182 and 183 have respective resonant frequencies equal to the center frequency of the pass band of FACT 202. The impedance of parallel resonant circuits 182 and 183 depends on a relationship between the signal frequency and the resonant frequency of the respective resonant circuit, and is a maximum at the resonant frequency. At signal frequencies above and below the resonant frequency, the impedance of the parallel resonant circuits 182 and 183 is less than at the resonant frequency, but is substantially greater than that of parasitic capacitors $C_P$ and $C_P'$ alone at all signal frequencies in the pass band of FACT 202. Accordingly, the current that flows between electrical circuit 141 and electrical circuit 142 through parallel resonant circuits 182 and 183 is substantially less than that which would flow through parasitic capacitors $C_P$ and $C_P'$ alone. Consequently, the common-mode rejection ratio of FACT 202 is greater than that of FACT 100 in the application shown in FIG. 1C.

Figure 3A:
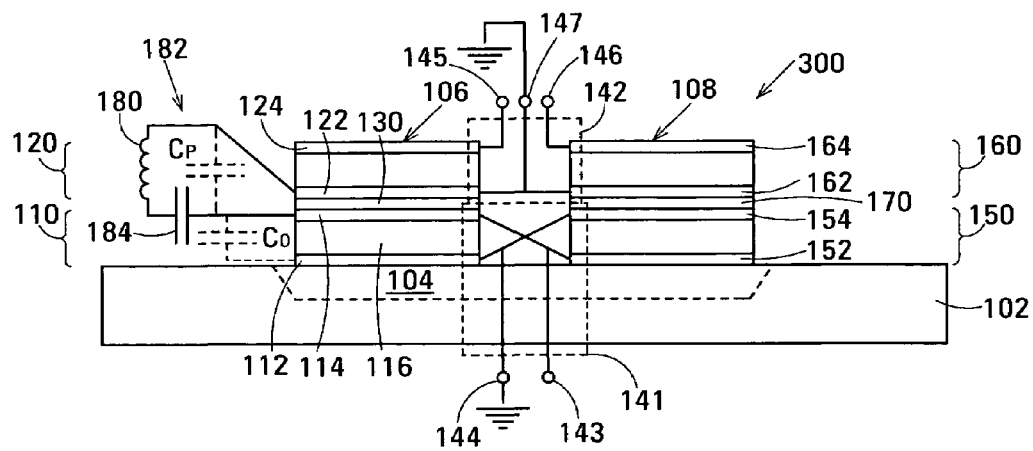
FIG. 3A is a schematic diagram of an exemplary grounded center tap embodiment of a FACT with high CMRR in accordance with the invention that provides DC isolation between primary and secondary.

In FACT 200 shown in FIG. 2A, inductor 180 interconnects electrical circuit 141 and electrical circuit 142 at DC. As a result, FACT 200 does not provide electrical isolation between electrical circuit 141 and electrical circuit 142 at DC. FIG. 3A is a schematic drawing showing an embodiment 300 of a FACT in accordance with the invention that additionally provides electrical isolation between electrical circuits 141 and 142 at DC voltages up to the breakdown voltage of an isolating capacitor 184 connected in series with inductor 180. FACT 300 is for use in an application similar to that described above with reference to FIG. 1B in which electrodes 112 and 154 connected to terminal 144 are grounded and electrodes 122 and 162 connected to center tap terminal 147 are also grounded. Elements of the FACT 300 shown in FIG. 3A that correspond to elements of FACT 200 shown in FIG. 2A are indicated using the same reference numerals and will not be described again here.

In FACT 300, isolating capacitor 184 and inductor 180 are connected in series between electrode 114 and electrode 122 on opposite sides of acoustic decoupler 130. As described above, inductor 180 and the parallel combination of parasitic capacitor $C_P$ and inter-electrode capacitance $C_0$ form a parallel resonant circuit 182 that reduces the current flow between electrical circuit 141 and electrical circuit 142. Inductor 180 additionally forms a series resonant circuit with isolating capacitor 184. Typically, the capacitance of isolating capacitor 184 is at least four times that of the parallel combination of parasitic capacitor $C_P$ and inter-electrode capacitance $C_0$ so that the series resonant frequency of inductor 180 and isolating capacitor 184 is at least one octave lower than the parallel resonant frequency of inductor 180 and the parallel combination of parasitic capacitance $C_P$ and inter-electrode capacitance $C_0$. This puts the series resonant frequency outside the pass band of FACT 300. As a result, isolating capacitor 184 has a negligible effect on the frequency response of the parallel resonance in the pass band of FACT 300. The capacitance of isolating capacitor 184 may alternatively be less than that just described, but in this case, the effect of isolating capacitor 184 on the frequency response of the parallel resonance in the pass band of FACT 300 may be less than negligible.

Figure 3B:
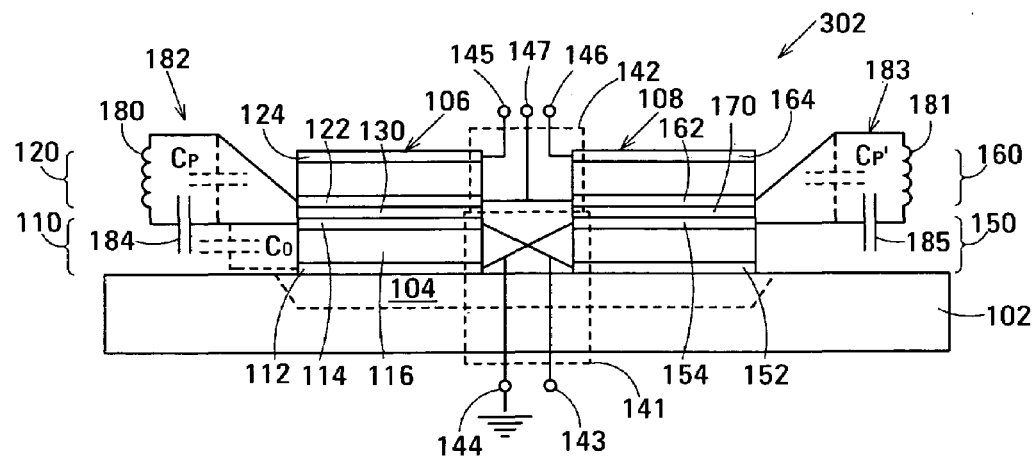
FIG. 3B is a schematic diagram of an exemplary floating center tap embodiment of a FACT with high CMRR in accordance with the invention that provides DC isolation between primary and secondary.

FIG. 3B is a schematic drawing showing an embodiment 302 of a FACT in accordance with the invention. FACT 302 is for use in an application similar to that described above with reference to FIG. 1C in which electrodes 112 and 154 are grounded and electrical circuit 142 is floating. Elements of the FACT 302 shown in FIG. 3B that correspond to elements of FACT 202 shown in FIG. 2B are indicated using the same reference numerals and will not be described again here. FACT 302 has inductor 180 and isolating capacitor 184 connected in series between the electrode 114 and electrode 122 on opposite sides of acoustic decoupler 130 and inductor 181 and an isolating capacitor 185 connected in series between electrode 154 and electrode 162 on opposite sides of acoustic decoupler 170.

Inductor 180 and isolating capacitor 184 connected in series reduce current flow between electrical circuit 141 and electrical circuit 142 and isolate electrical circuit 141 from electrical circuit 142 at DC in the manner described above. Inductor 181 and isolating capacitor 185 connected in series reduce current flow between electrical circuit 141 and electrical circuit 142 and isolate electrical circuit 141 from electrical circuit 142 at DC in a manner similar to that described above.

Figure 4A:
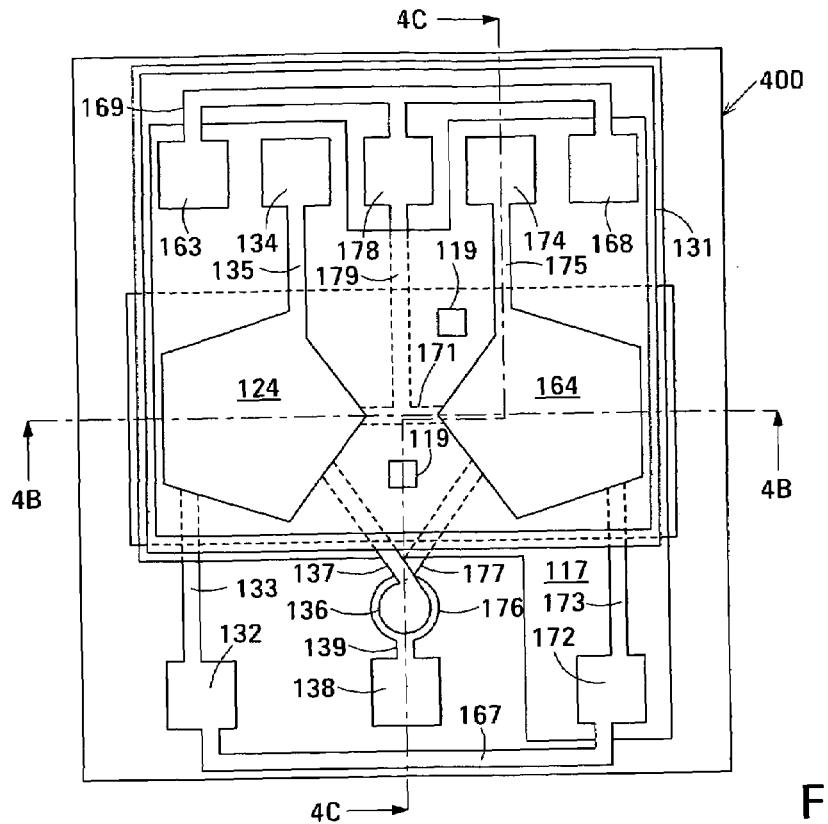
FIGS. 4A, 4B and 4C are respectively a plan view and cross-sectional views along the section lines 4B—4B and 4C—4C in FIG. 4A of a FACT module with high CMRR that forms the basis of practical embodiments of a FACT in accordance with the invention.
Figure 4B:
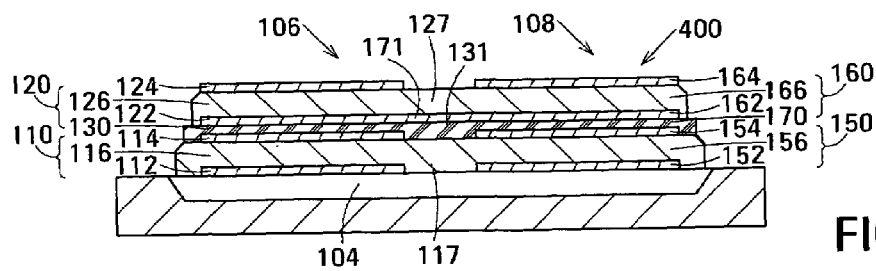
Figure 4C:
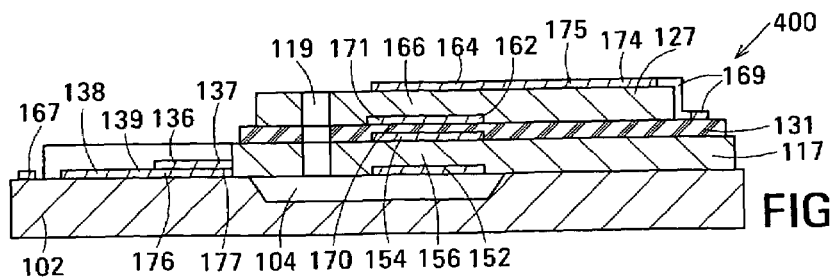

FIGS. 4A–4C are respectively a plan view and two cross-sectional views of an embodiment 400 of a film acoustically-coupled transformer (FACT) module that forms part of practical embodiments of a FACT with a high common-mode rejection ratio to be described below. Elements of FACT module 400 that correspond to elements of FACT 100 described above with reference to FIGS. 1A and 1B are indicated by the same reference numeral and will not be described again here.

FACT module 400 is composed of a substrate 102 and decoupled stacked bulk acoustic resonators (DSBARs) 106 and 108. Each DSBAR is composed of a lower film bulk acoustic resonator (FBAR), an upper FBAR and an acoustic decoupler between the FBARs. FACT module 400 is additionally composed of an electrical circuit that connects the lower FBAR 110 of DSBAR 106 to the lower FBAR 150 of DSBAR 108, and an electrical circuit that connects the upper FBAR 120 of DSBAR 106 to the upper FBAR 160 of DSBAR 108.

In DSBAR 106, lower FBAR 110 is composed of opposed planar electrodes 112 and 114 and a piezoelectric element 116 between the electrodes, and upper FBAR 120 is composed of opposed planar electrodes 122 and 124 and a piezoelectric element 126 between the electrodes. In DSBAR 108, lower FBAR 150 is composed of opposed planar electrodes 152 and 154 and a piezoelectric element 156 between the electrodes, and upper FBAR 160 is composed of opposed planar electrodes 162 and 164 and a piezoelectric element 166 between the electrodes.

In FACT module 400, in DSBAR 106, acoustic decoupler 130 is located between lower FBAR 110 and upper FBAR 120; specifically, between electrode 114 of lower FBAR 110 and electrode 122 of upper FBAR 120. Acoustic decoupler 130 controls the coupling of acoustic energy between FBARs 110 and 120. Acoustic decoupler 130 couples less acoustic energy between the FBARs 110 and 120 than would be coupled if the FBARs were in direct contact with one another, Additionally, in DSBAR 108, acoustic decoupler 170 is located between FBARs 150 and 160; specifically, between electrode 154 of lower FBAR 150 and electrode 162 of upper FBAR 160. Acoustic decoupler 170 controls the coupling of acoustic energy between FBARs 150 and 160. Acoustic decoupler 170 couples less acoustic energy between the FBARs 150 and 160 than would be coupled if the FBARs were in direct contact with one another. The coupling of acoustic energy defined by acoustic decouplers 130 and 170 determines the bandwidth of the passband of FACT module 400.

In the example shown in FIGS. 4A–4C, acoustic decouplers 130 and 170 are respective parts of an acoustic decoupling layer 131. Acoustic decoupling layer 131 is a layer of acoustic decoupling material. One important property of the acoustic decoupling material of acoustic decoupling layer 131 is an acoustic impedance significantly different from than that of FBARs 110, 120, 150 and 160. Other important properties of the acoustic decoupling material are a high electrical resistivity and low dielectric permittivity to provide electrical isolation between the primary and secondary of the FACT.

Acoustic decoupling layer 131 has a nominal thickness t between electrodes 114 and 122 and between electrodes 154 and 162 equal to an odd integral multiple of one quarter of the wavelength $\lambda_n$ in the acoustic decoupling material of an acoustic signal equal in frequency to the center frequency of the pass band of FACT module 400, i.e., $t \approx (2m+1)\lambda_n/4$, where m is an integer equal to or greater than zero. Such an acoustic decoupling layer imposes a phase change of an odd integral multiple of $\pi/2$ radians on an acoustic signal having a frequency nominally equal to the center frequency of the pass band of FACT module 400. An acoustic decoupling layer that differs from the nominal thickness by approximately 35 10% of $\lambda_n/4$ can alternatively be used. A thickness tolerance outside this range can be used with some degradation in performance, but the thickness of acoustic decoupling layer 131 should differ significantly from an integral multiple of $\lambda_n/2$.

Embodiments of FACT module 400 incorporating an embodiment of acoustic decoupling layer 131 in which the value of integer m is zero ($t=\lambda_n/4$) have a frequency response substantially closer to an ideal frequency response than embodiments in which the acoustic decoupling layer has a nominal thickness greater than $\lambda_n/4$ (m>0). Such an embodiment of the acoustic decoupling layer will be referred to as a minimum-thickness acoustic decoupling layer. A minimum-thickness acoustic decoupling layer imposes a phase change of π/2 radians on an acoustic signal having a frequency nominally equal to the center frequency of the pass band of FACT module 400. The frequency response of embodiments of the FACT module having a minimum-thickness acoustic decoupling layer lacks the above-mentioned spurious response artifacts exhibited by embodiments in which the nominal thickness of the acoustic decoupling layer is greater than the minimum. As noted above, a smooth frequency response has hitherto been obtained at the expense of parasitic capacitor $C_P$ having a substantially greater capacitance, and embodiments having a smooth frequency response have therefore typically had a low common-mode rejection ratio. Embodiments of the FACT in accordance with the invention use an inductor to reduce the effect of the high parasitic capacitance resulting from a minimum-thickness acoustic decoupling layer. Thus, embodiments of the FACT in accordance with the invention have both a high CMRR and the smooth frequency response provided by the minimum-thickness acoustic decoupling layer.

An inductor, or an inductor and a blocking capacitor in series, may be connected between the electrodes located on opposite sides of the acoustic decoupler in any device, such as an acoustically-coupled transformer or a band-pass filter, that incorporates one or more DSBARs to reduce effect of the parasitic capacitance between the constituent FBARs on the properties of the device. Such devices will be referred to generically as DSBAR devices. Reducing the effect of the parasitic capacitance allows the benefits of using a minimum-thickness acoustic decoupler to be obtained in any DSBAR device.

Many plastic materials have acoustic impedances in the range stated above and can be applied in layers of uniform thickness in the thickness ranges stated above. Such plastic materials are therefore potentially suitable for use as the acoustic decoupling material of acoustic decoupling layer 131 that provides acoustic decouplers 130 and 170. However, the acoustic decoupling material must also be capable of withstanding the temperatures of the fabrication operations performed after acoustic decoupling layer 131 has been deposited on electrodes 114 and 154 to form acoustic decouplers 130 and 170. Electrodes 122, 124, 162 and 164 and piezoelectric elements 126 and 166 are deposited by sputtering after acoustic decoupling layer 131 has been deposited. Temperatures as high as 300° C. are reached during these deposition processes. Thus, a plastic that remains stable at such temperatures is used as the acoustic decoupling material.

In one embodiment, a polyimide is used as the acoustic decoupling material of layer 131. Polyimide is sold under the trademark Kapton® by E. I. du Pont de Nemours and Company. In such embodiment, acoustic decouplers 130 and 170 are composed of layer 131 of polyimide applied to electrodes 114 and 154 by spin coating. Polyimide has an acoustic impedance of about 4 megarayleigh (Mrayl).

In another embodiment, a poly(para-xylylene) is used as the acoustic decoupling material of layer 131. In such embodiment, acoustic decouplers 130 and 170 are composed of layer 131 of poly(para-xylylene) applied to electrodes 114 and 154 by vacuum deposition. Poly(para-xylylene) is also known in the art as parylene. The dimer precursor di-para-xylylene from which parylene is made and equipment for performing vacuum deposition of layers of parylene are available from many suppliers. Parylene has an acoustic impedance of about 2.8 Mrayl.

In another embodiment, the acoustic decoupling material of acoustic decoupling layer 131 is a crosslinked polyphenylene polymer. In such embodiment, acoustic decoupling layer 131 is a layer of a crosslinked polyphenylene polymer Crosslinked polyphenylene polymers have been developed as low dielectric constant dielectric materials for use in integrated circuits and consequently remain stable at the high temperatures to which acoustic decoupling layer 131 is subject during the subsequent fabrication of FBARs 120 and 160. The inventors have discovered that crosslinked polyphenylene polymers additionally have a calculated acoustic impedance of about 2 Mrayl. This acoustic impedance is in the range of acoustic impedances that provides FACT module 400 with a useful pass bandwidth.

Precursor solutions containing various oligomers that polymerize to form respective crosslinked polyphenylene polymers are sold by The Dow Chemical Company, Midland, Mich., under the trademark SiLK. The precursor solutions are applied by spin coating. The crosslinked polyphenylene polymer obtained from one of these precursor solutions designated SiLK™ J, which additionally contains an adhesion promoter, has a calculated acoustic impedance of 2.1 Mrayl, i.e., about 2 Mrayl.

The oligomers that polymerize to form crosslinked polyphenylene polymers are prepared from biscyclopentadienone- and aromatic acetylene-containing monomers. Using such monomers forms soluble oligomers without the need for undue substitution. The precursor solution contains a specific oligomer dissolved in gamma-butyrolactone and cyclohexanone solvents. The percentage of the oligomer in the precursor solution determines the layer thickness when the precursor solution is spun on. After application, applying heat evaporates the solvents, then cures the oligomer to form a cross-linked polymer. The biscyclopentadienones react with the acetylenes in a 4+2 cycloaddition reaction that forms a new aromatic ring. Further curing results in the cross-linked polyphenylene polymer. The above-described crosslinked polyphenylene polymers are disclosed by Godschalx et al. in U.S. Pat. No. 5,965,679, incorporated herein by reference. Additional practical details are described by Martin et al., Development of Low-Dielectric Constant Polymer for the Fabrication of Integrated Circuit Interconnect, 12 ADVANCED MATERIALS, 1769 (2000), also incorporated by reference. Compared with polyimide, crosslinked polyphenylene polymers have a lower acoustic impedance, a lower acoustic attenuation and a lower dielectric constant. Moreover, a spun-on layer of the precursor solution is capable of producing a high-quality film of the crosslinked polyphenylene polymer with a thickness of the order of 200 nm, which is a typical thickness of acoustic decoupling layer 131.

In another embodiment, acoustic decouplers 130 and 170 are composed of acoustic decoupling layers (not shown) of acoustic decoupling materials having different acoustic impedances as described in the above-mentioned U.S. patent application Ser. No. 10/965,449 of John D. Larson III and Stephen Ellis entitled Pass Bandwidth Control in Decoupled Stacked Bulk Acoustic Resonator Devices. The acoustic impedances and thicknesses of the acoustic decoupling layers collectively define the acoustic impedance of, and phase change imposed by, acoustic decouplers 130 and 170. The acoustic impedance of the acoustic decouplers in turn defines the pass bandwidth of FACT module 400.

In an exemplary embodiment, the acoustic decouplers were composed of an acoustic decoupling layer of crosslinked polyphenylene polymer atop of an acoustic decoupling layer of polyimide. Such acoustic decouplers provide an embodiment of FACT module 400 with a pass bandwidth intermediate between the pass bandwidths of embodiments in which the acoustic decouplers are composed of single acoustic decoupling layer 131 of polyimide or are composed of single acoustic decoupling layer 131 of the crosslinked polyphenylene polymer.

In an alternative embodiment, the acoustic decoupling material of acoustic decoupling layer 131 has an acoustic impedance substantially greater than the materials of FBARs 110 and 120. No materials having this property are known at this time, but such materials may become available in future, or lower acoustic impedance FBAR materials may become available in future. The thickness of acoustic decoupling layer 131 of such high acoustic impedance acoustic decoupling material is as described above.

In another embodiment (not shown), acoustic decouplers 130 and 170 each include a Bragg structure composed of a low acoustic impedance Bragg element sandwiched between high acoustic impedance Bragg elements. The low acoustic impedance Bragg element is a layer of a low acoustic impedance material whereas the high acoustic impedance Bragg elements are each a layer of high acoustic impedance material. The acoustic impedances of the Bragg elements are characterized as "low" and "high" with respect to one another and additionally with respect to the acoustic impedance of the piezoelectric material of layers 116, 126, 156 and 166. At least one of the Bragg elements additionally has a high electrical resistivity and a low dielectric permittivity to provide electrical isolation between input and output of FACT module 400.

Each of the layers constituting the Bragg elements has a nominal thickness equal to an odd integral multiple of one quarter of the wavelength in the material of the layer of an acoustic signal equal in frequency to the center frequency of FACT module 400. Layers that differ from the nominal thickness by approximately ±10% of one quarter of the wavelength can alternatively be used. A thickness tolerance outside this range can be used with some degradation in performance, but the thickness of the layers should differ significantly from an integral multiple of one-half of the wavelength.

In an embodiment, the low acoustic impedance Bragg element is a layer of silicon dioxide ($SiO_2$), which has an acoustic impedance of about 13 Mrayl, and each of the high acoustic impedance Bragg elements is a layer of the same material as electrodes 114, 122, 154 and 162, e.g., molybdenum, which has an acoustic impedance of about 63 Mrayl. Using the same material for the high acoustic impedance Bragg elements and the electrodes of FBARs 110, 120, 150 and 160 allows the high acoustic impedance Bragg elements additionally to serve as the electrodes of the FBARs adjacent the acoustic coupling elements.

DSBAR 106 and DSBAR 108 are located adjacent one another suspended over cavity 104 defined in a substrate 102. Suspending the DSBARs over a cavity allows the stacked FBARs in each DSBAR to resonate mechanically. Other suspension schemes that allow the stacked FBARs to resonate mechanically are possible. For example, the DSBARs can be located over a mismatched acoustic Bragg reflector (not shown) formed in or on substrate 102, as disclosed by Lakin in U.S. Pat. No. 6,107,721.

Referring additionally to FIG. 2A, a bonding pad 138 located on the major surface of substrate 102 provides the signal terminal 143 of electrical circuit 141 of FACT module 400. A bonding pad 132 located on the major surface of substrate 102 and a bonding pad 172 located on the major surface of piezoelectric layer 117 that provides piezoelectric elements 116 and 156 collectively constitute the ground terminal 144 of electrical circuit 141. An interconnection pad 176 located on the major surface of the substrate, an electrical trace 177 extending from electrode 152 to interconnection pad 176, an interconnection pad 136 in electrical contact with interconnection pad 176, an electrical trace 137 extending from electrode 114 to interconnection pad 136, and an electrical trace 139 extending from interconnection pad 176 to bonding pad 138 constitute the part of electrical circuit 141 that electrically connects electrode 114 of FBAR 110 to electrode 152 of FBAR 150 and to signal terminal 143. Electrical trace 133 extending from electrode 112 to bonding pad 132, electrical trace 167 extending from bonding pad 132 to bonding pad 172 and electrical trace 173 extending from electrode 154 to bonding pad 172 constitute the part of electrical circuit 141 that electrically connects electrode 112 of FBAR 110 to electrode 154 of FBAR 150.

Bonding pad 134 and bonding pad 174 located on the major surface of the piezoelectric layer 127 that provides piezoelectric elements 126 and 166 constitute signal terminals 145 and 146 of electrical circuit 142. Bonding pad 178 located on the major surface of acoustic decoupling layer 131 constitutes center-tap terminal 147 of electrical circuit 142. Bonding pads 163 and 168 located on the major surface of piezoelectric layer 127 provide additional ground connections.

An electrical trace 171 that extends between electrode 122 and electrode 162 over the surface of the acoustic decoupling layer 131 and an electrical trace 179 that extends between electrical trace 171 and bonding pad 178 constitute the part of electrical circuit 142 that connects FBAR 120 and FBAR 160 in series and to center-tap terminal 147. An electrical trace 135 that extends between electrode 124 and bonding pad 134 and an electrical trace 175 that extends between electrode 154 and bonding pad 174 constitute the part of electrical circuit 142 that connects FBAR 120 and FBAR 160 to signal terminals 145 and 146. Electrical trace 169 extends between bonding pad 163 and bonding pad 168 that provide the ground terminals of electrical circuit 142. In this embodiment electrical trace 169 additionally extends to bonding pad 178 to connect center tap terminal 147 (FIG. 2A) to the ground of electrical circuit 142.

Thousands of FACT modules similar to FACT module 400 are fabricated at a time by wafer-scale fabrication. Such wafer-scale fabrication makes the FACT modules inexpensive to fabricate. An exemplary fabrication process that, with different masks, can be used to fabricate embodiments of FACT module 400 will be described below.

Figure 5:
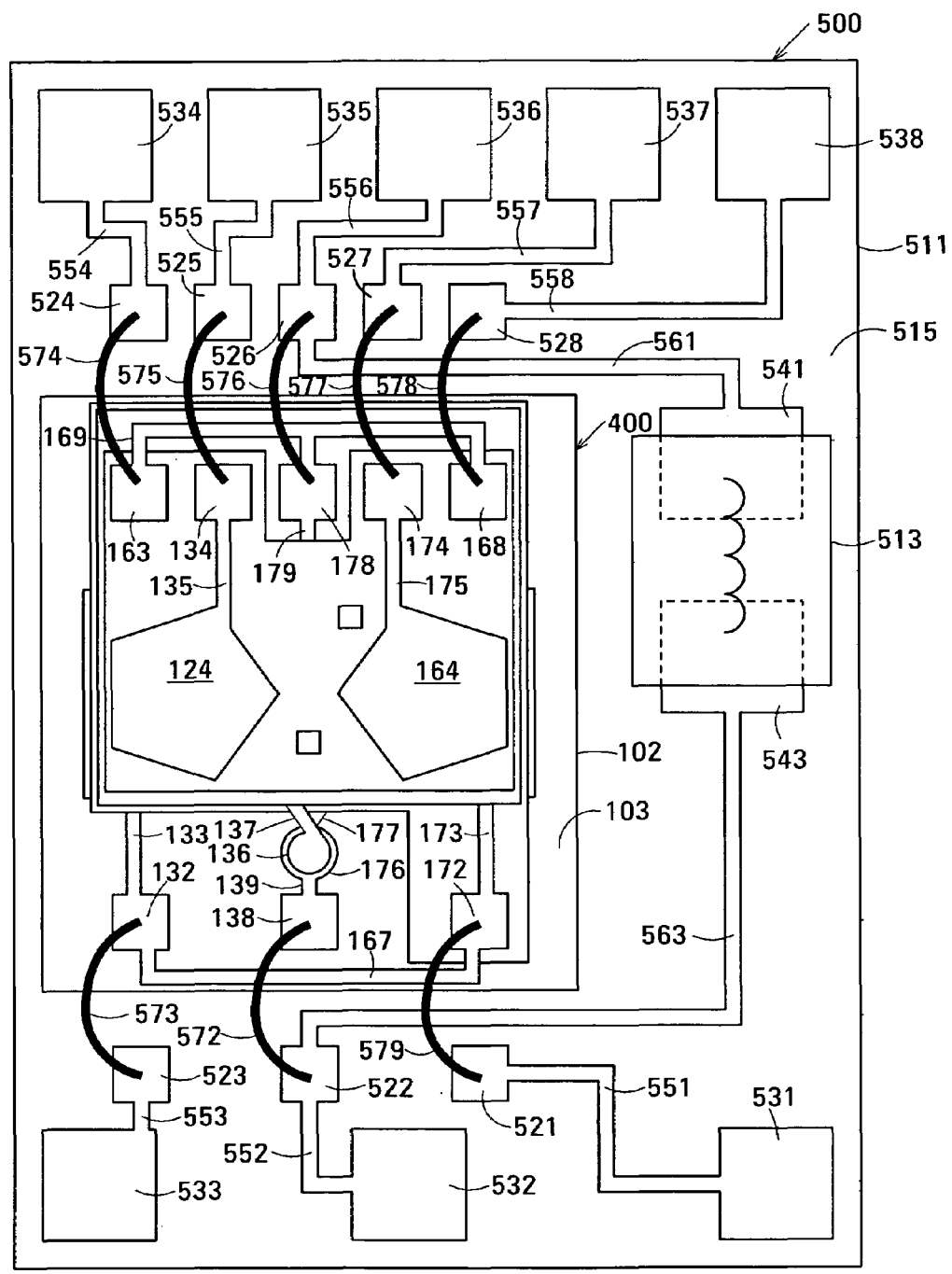
FIG. 5 is a plan view of a first practical embodiment of a FACT with high CMRR in accordance with the invention.

FIG. 5 is a plan view of a first practical embodiment 500 of a FACT with increased CMRR in accordance with the invention. Elements of FACT 500 that correspond to FACT module 400 shown in FIGS. 4A–4C are indicated using the same reference numerals and will not be described again here.

FACT 500 is composed of FACT module 400, a daughter board 511 and inductor 180 (FIG. 2A) embodied in the example shown as a surface-mount inductor 513. Defined in a conductive layer on the major surface 515 of daughter board 511 are bonding pads 521, 522, 523, 524, 525, 526, 527 and 528, terminal pads 531, 532, 533, 534, 535, 536, 537, and 538 and attachment pads 541 and 543. Also defined in the conductive layer of daughter board 511 are a trace 551 that extends between bonding pad 521 and terminal pad 531; a trace 552 that extends between bonding pad 522 and terminal pad 532; a trace 553 that extends between bonding pad 523 and terminal pad 533; a trace 554 that extends between bonding pad 524 and terminal pad 534; a trace 555 that extends between bonding pad 525 and terminal pad 535; a trace 556 that extends between bonding pad 526 and terminal pad 536; a trace 557 that extends between bonding pad 527 and terminal pad 537; and a trace 558 that extends between bonding pad 528 and terminal pad 538.

Also defined in the conductive layer of daughter board 511 are a trace 561 that extends between bonding pad 526 and attachment pad 541 and a trace 563 that extends between bonding pad 522 and attachment pad 543.

FACT module 400 is mounted on the major surface 515 of daughter board 511 with bonding pads 172, 138, 132, 163, 134, 178, 174 and 168 opposite bonding pads 521, 522, 523, 524, 525, 526, 527 and 528, respectively. Bonding wires 571, 572, 573, 574, 575, 576, 577 and 578 extend between, and electrically connect, bonding pads 172, 138, 132, 163, 134, 178, 174 and 168, respectively, of FACT module 400 and bonding pads 521, 522, 523, 524, 525, 526, 527 and 528, respectively, of daughter board 511.

Alternatively, FACT module 400 is configured with terminal pads (not shown) located on the major surface (not shown) of substrate 102 opposite major surface 103 in a manner similar to that described below with reference to FIGS. 8A–8C. The terminal pads are electrically connected by vias (not shown) extending through the substrate to bonding pads 172, 138, 132, 163, 134, 178, 174 and 168. Bonding pads 521, 522, 523, 524, 525, 526, 527 and 529, respectively, are located on the major surface 515 of daughter board 511 in positions corresponding to the positions of the terminal pads on FACT module 400. FACT module 400 is then mounted on daughter board 511 with the terminal pads on the FACT module connected to the bonding pads on the daughter board using solder bumps or another suitable connection technique.

Surface-mount inductor 513 is mounted on attachment pads 541 and 543. Alternatively, a non surface-mount inductor may be electrically connected to attachment pads 541 and 543.

In FACT 500, one end of inductor 513 is electrically connected to electrode 122 of FBAR 120 (FIG. 4B) by attachment pad 541, trace 561, bonding pad 526, bonding wire 576, bonding pad 178, trace 179 and part of trace 171 (FIG. 4A). Additionally, the other end of inductor 513 is electrically connected to electrode 114 of FBAR 110 by attachment pad 543, trace 563, bonding pad 522, bonding wire 572, bonding pad 138, trace 139, interconnection pads 176 and 136 and trace 137. Thus, inductor 513 is connected to electrodes 114 and 122 on opposite sides of acoustic decoupler 130 in a manner similar to that shown in FIG. 2A.

In an example of FACT 500 structured for operation at a frequency of about 1.9 GHz, in which acoustic decouplers 130 and 170 had a nominal thickness equal to one quarter of the wavelength in the acoustic decoupling material of an acoustic signal equal in frequency to the center frequency of the pass band of the FACT, the parasitic capacitor $C_P$ between electrodes 114 and 122 was about 1 pF, the capacitance $C_O$ between input terminals 143 and 144 (FIG. 2A) was about 1.2 pF and the inductance of inductor 513 was about 3.2 nH.

Figure 6:
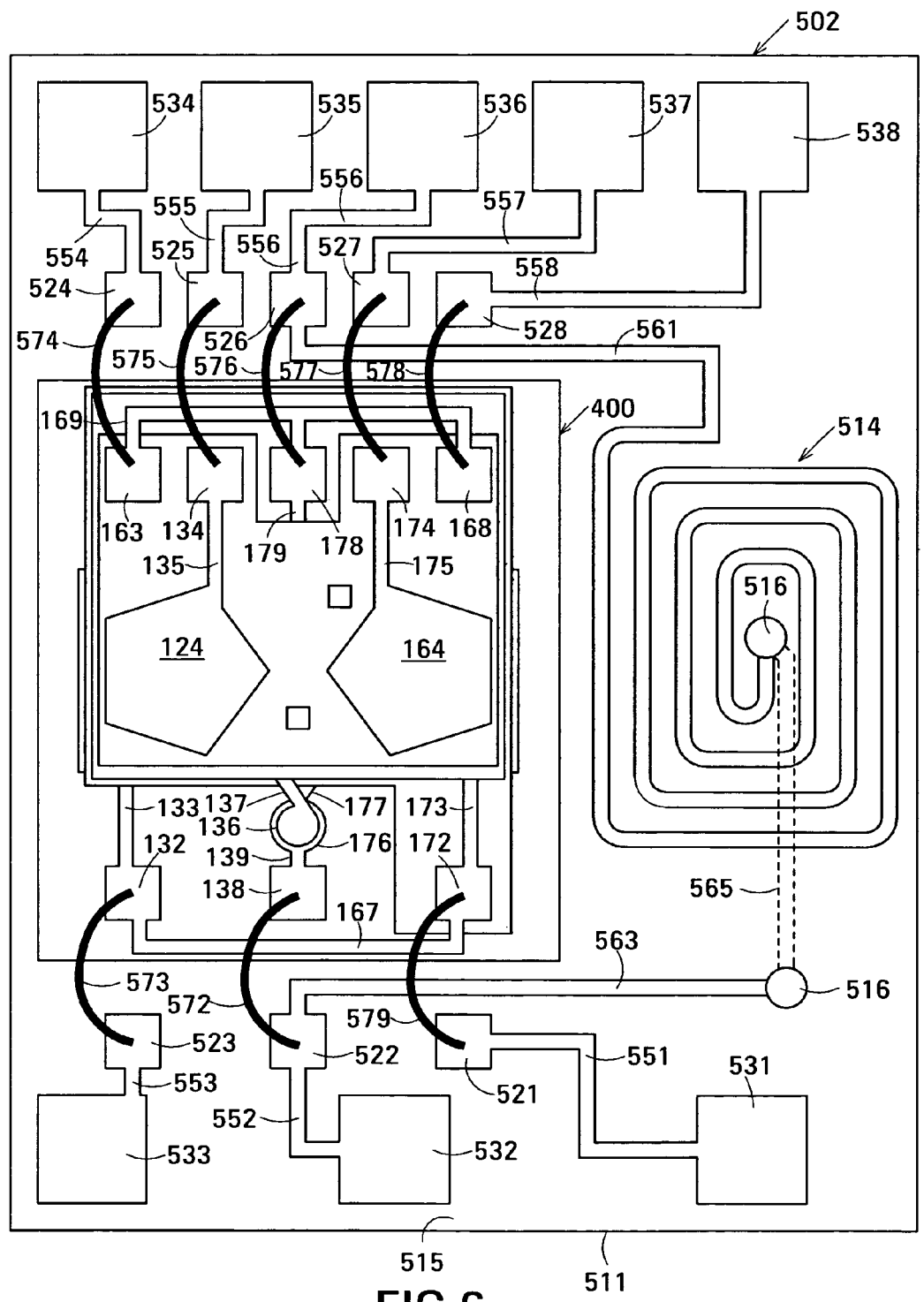
FIG. 6 is a plan view of a second practical embodiment of a FACT with high CMRR in accordance with the invention.

FIG. 6 is a plan view of a second practical embodiment 502 of a FACT with increased CMRR in accordance with the invention. Elements of FACT 502 that correspond to FACT module 500 shown in FIG. 5 and FACT module 400 shown in FIGS. 4A–4C are indicated using the same reference numerals and will not be described again here.

In FACT 502, inductor 180 is embodied as a spiral trace 514 defined in the conductive layer of daughter board 511. In this embodiment, daughter board 511 is a multi-layer board and trace 565 is at a level below the major surface 515 of the daughter board. Trace 565 is connected to spiral trace 514 and to trace 563 by vias 516. Alternatively, inductor 180 may be embodied as a serpentine trace defined in the conductive layer of daughter board 511. In this case, daughter board 511 need not be a multi-layer board.

Figure 7:
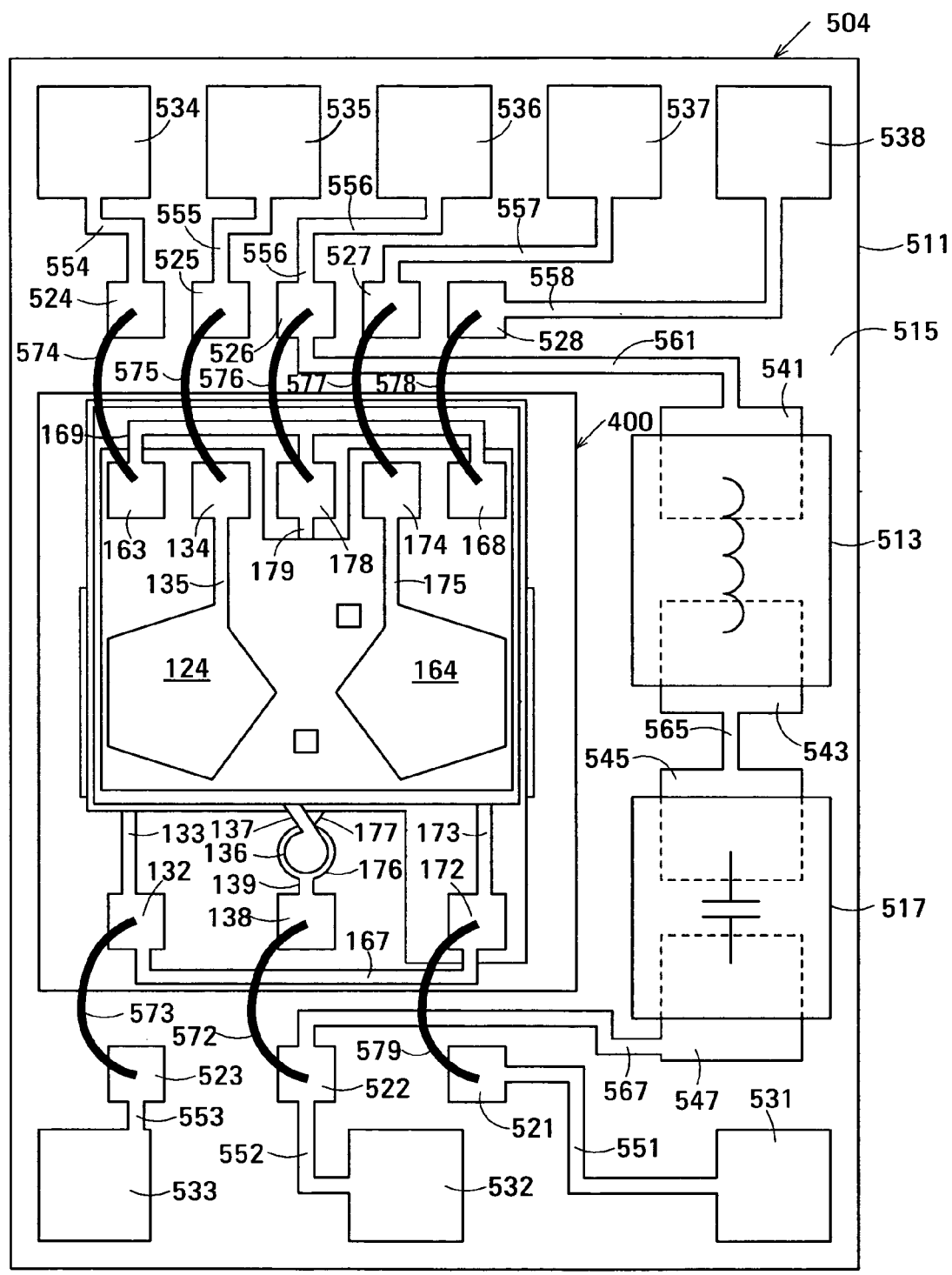
FIG. 7 is a plan view of a third practical embodiment of a FACT with high CMRR in accordance with the invention that provides DC isolation between primary and secondary.

FIG. 7 is a plan view of a third practical embodiment 504 of a FACT with increased CMRR in accordance with the invention. FACT 504 provides DC isolation between electrical circuits 141 and 142 (FIG. 3A). Elements of FACT 504 that correspond to FACT module 500 shown in FIG. 5 and FACT module 400 shown in FIGS. 4A–4C are indicated using the same reference numerals and will not be described again here.

FACT 504 is composed of FACT module 400, daughterboard 511, inductor 180 (FIG. 3A) embodied in the example shown as surface-mount inductor 513, and isolating capacitor 184 (FIG. 3A) embodied in the example shown as a surface-mount capacitor 517. Additionally defined in a conductive layer on the major surface 515 of daughter board 511 are attachment pads 545 and 547 and conductive traces 565 and 567. Conductive trace 565 extends between attachment pad 543 and attachment pad 545 and conductive trace 567 extends between attachment pad 547 and bonding pad 522.

Surface-mount inductor 513 is mounted on attachment pads 541 and 543 as described above. Surface-mount capacitor 517 is mounted on attachment pads 545 and 547. Alternatively, a non surface-mount inductor may be electrically connected to attachment pads 541 and 543 and/or a non surface-mount isolating capacitor may be electrically connected to attachment pads 545 and 547. An inductor defined in the conductive layer of daughter board 511 similar to spiral trace 514 described above with reference to FIG. 6 may be substituted for attachment pads 541 and 543 and surface-mount inductor 513.

In FACT 504, one end of inductor 513 is electrically connected to electrode 122 of FBAR 120 (FIG. 4B) by attachment pad 541, trace 561, bonding pad 526, bonding wire 576, bonding pad 178, trace 179 (FIG. 4A) and part of trace 171 (FIG. 4A). The other end of inductor 513 is electrically connected to one end of isolating capacitor 517 by attachment pad 543, trace 565 and attachment pad 545. The other end of isolating capacitor 517 is connected to electrode 114 of FBAR 110 by attachment pad 547, trace 567, bonding pad 522, bonding wire 572, bonding pad 138, trace 139, interconnection pad 176, interconnection pad 136 and trace 137. Thus, inductor 513 and isolating capacitor 517 connected in series are connected to electrodes 114 and 122 on opposite sides of acoustic decoupler 130 in a manner similar to that shown in FIG. 3A.

In an example similar to that described above with reference to FIG. 5 in which the parasitic capacitor $C_P$ was about 1 pF and inter-terminal capacitance $C_O$ was about 1.2 pF, isolating capacitor 517 had a capacitance of about 8 pF and a breakdown voltage greater than the maximum DC voltage specified between electrical circuits 141 and 142 (FIG. 3A).

Each of FACTs 500, 600 and 700 is used by mounting daughter board 511 on the printed circuit board of a host electronic device (not shown), such as a cellular telephone, and making electrical connections between terminal pads 531, 532, 533, 534, 535, 536, 537 and 538 and corresponding pads on the printed circuit board. Many techniques are known in the art for mounting a daughter board on a printed circuit board and will therefore not be described here. Daughter board 511 may alternatively be structured so that it can be mounted on the printed circuit board of the host electronic device as a flip chip or using solder bumps.

Figure 8C:
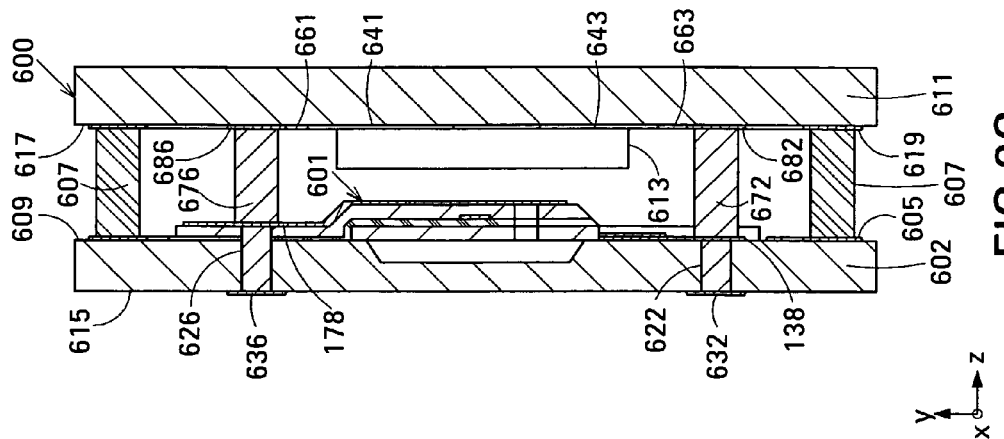
FIGS. 8A, 8B and 8C are respectively a plan view, a side view and a cross-sectional view along the section line 8C—8C in FIG. 8A of a fourth practical embodiment of a FACT with high CMRR in accordance with the invention.
Figure 8B:
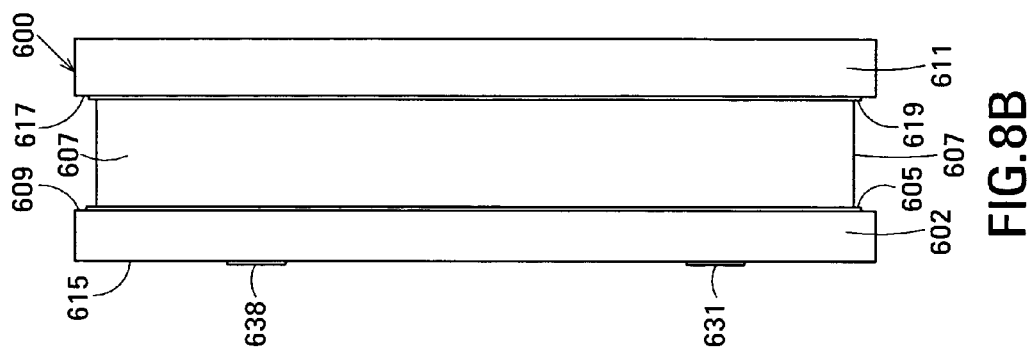
Figure 8A:
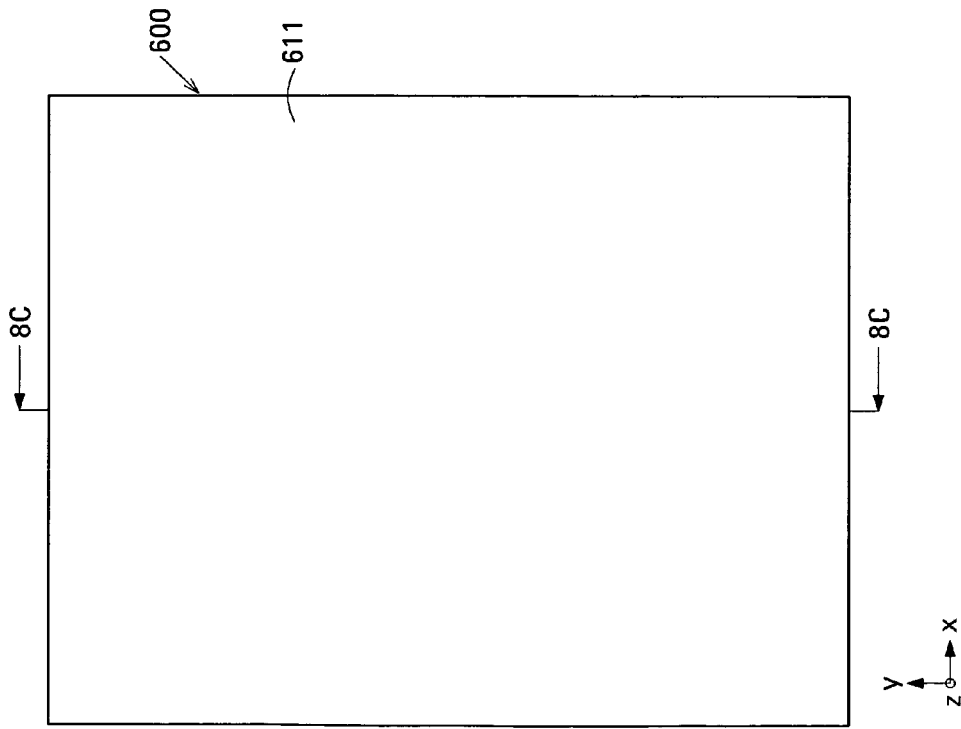
Figure 8D:
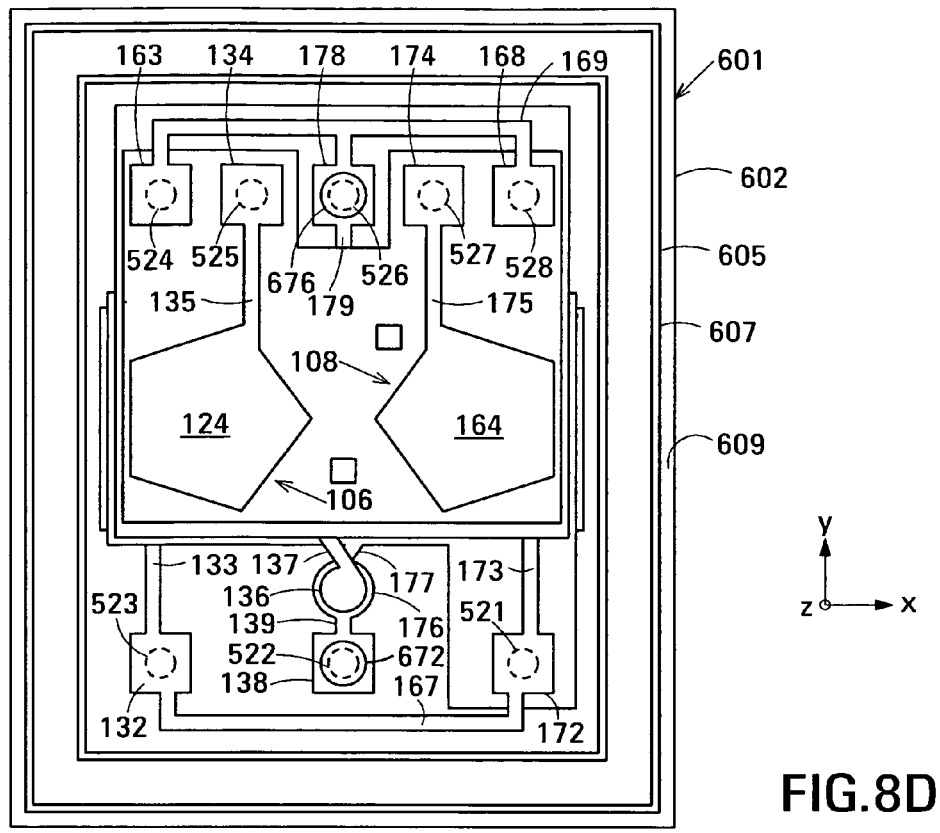
FIGS. 8D and 8E are plan views of the substrates that constitute part of the FACT shown in FIGS. 8A–8C.
Figure 8E:
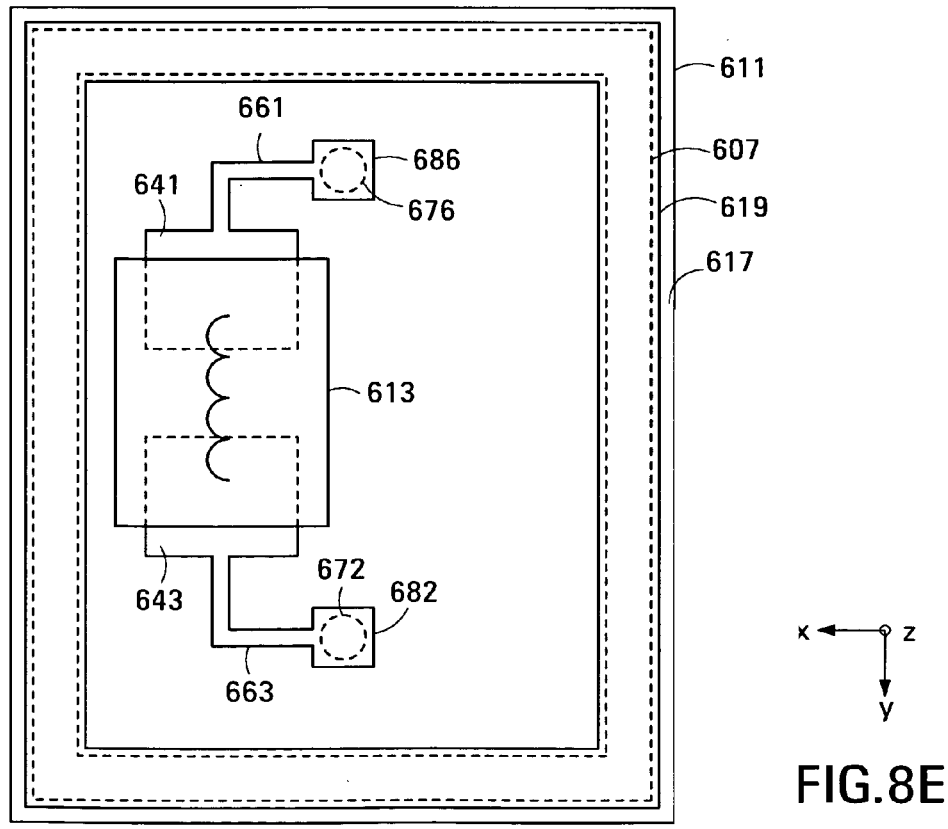

FIGS. 8A, 8B and 8C are respectively a plan view, a side view and a cross-sectional view along the section line 8C—8C in FIG. 8A of a fourth practical embodiment 600 of a FACT with high CMRR in accordance with the invention. In FACT 600, DSBARs 106 and 108, electrical circuits 141 and 142 and inductor 181 are enclosed in a hermetic enclosure of which the substrate of the FACT module forms part. FIGS. 8D and 8E are respectively plan views of an embodiment 601 of FACT module 400 and an auxiliary substrate 611 that, together with an annular gasket 607, form FACT 600. Elements of FACT 600 that correspond to FACT module 400 shown in FIGS. 4A–4C are indicated using the same reference numerals and will not be described again here.

FACT 600 is composed of embodiment 601 of FACT module 400 described above with reference to FIGS. 4A–4C, auxiliary substrate 611, annular gasket 607, and inductor 180 (FIG. 2A) embodied in the example shown as surface-mount inductor 613. FIG. 8D is a plan view of FACT module 601 that forms part of FACT 600. FACT module 601 has a substrate 602 that is extended in the x- and y-directions relative to the substrate 102 of the embodiment of FACT module 400 described above with reference to FIGS. 4A–4C. An annular pad 605 is located on the major surface 609 of substrate 602 surrounding DSBARs 106 and 108 (FIG. 4A) and bonding pads 172, 138, 132, 163, 134, 178, 174 and 168. Bonding pads 132 and 138 and interconnection pad 176 are located on major surface 609. Annular gasket 607 typically has a dimension in the z-direction greater than the sum of the z-direction dimensions of DSBAR 106 or DSBAR 108 and surface-mount inductor 613 and is located on annular pad 605.

A terminal pad is located on the major surface 615 of substrate 602 opposite each of bonding pads 172, 138, 132, 163, 134, 178, 174 and 168. Major surface 615 is opposite major surface 609. A conductive via extends through substrate 602 from each of the connection pads 132, 138, 178, 168 and 172 to its respective attachment pad. The locations of vias 621, 622, 623, 624, 625, 626, 627 and 628 are indicated by broken lines in FIG. 8D. The side view of FIG. 8B shows terminal pads 631 and 638 located on major surface 615. The cross-sectional view of FIG. 8C shows terminal pads 632 and 636 located on major surface 615 opposite bonding pads 138 and 178, respectively, and electrically connected to bonding pads 138 and 178, respectively, by vias 622 and 626, respectively, that extend through substrate 602.

Referring additionally to FIG. 8D, cylindrical interconnection posts 672 and 676 are located on the surface of bonding pads 138 and 178, respectively. Interconnection posts 672 and 676 have a dimension in the z-direction greater than or equal to the dimension of gasket 607 in the z-direction.

FIG. 6E shows the major surface 617 of auxiliary substrate 611. Major surface 617 is opposite major surface 609 of substrate 602 when FACT 600 is assembled. Located on major surface 617 are annular pad 619, connection pads 682 and 686, attachment pads 641 and 642 and electrical traces 661 and 663. In an embodiment, annular pad 619, connection pads 682 and 686, attachment pads 641 and 642 and electrical traces 661 and 663 are defined in a conductive layer (not shown) located on major surface 617.

Annular pad 619 is similar in shape and dimensions to annular pad 605 on substrate 602 and engages with gasket 607 when FACT 600 is assembled. Connection pads 682 and 686 are similar in shape and dimensions to bonding pads 138 and 178 and are arranged on major surface 617 relative to annular pad 619 such that they engage with interconnection posts 672 and 676, respectively, when annular pad 619 is engaged with gasket 607. The positions of interconnection posts 672 and 672 and of gasket 607 at engagement are indicated by broken lines in FIG. 6E. Electrical trace 661 extends from connection pad 686 to attachment pad 641 and electrical trace 663 extends from connection pad 682 to attachment pad 643.

Surface-mount inductor 613 is mounted on attachment pads 641 and 643. Alternatively, a non surface-mount inductor may be electrically connected to attachment pads 641 and 643.

In FACT 600, one end of inductor 613 is electrically connected to electrode 122 of FBAR 120 (FIG. 2B) by attachment pad 641, trace 661, connection pad 686, interconnection post 676, bonding pad 178, trace 179 and part of trace 171 (FIG. 4A). Additionally, the other end of inductor 613 is electrically connected to electrode 114 of FBAR 110 (FIG. 2B) by attachment pad 643, trace 663, connection pad 682, interconnection post 672, bonding pad 138, trace 139, interconnection pads 176 and 136 and trace 137. Thus, inductor 613 is connected to electrodes 114 and 122 on opposite sides of acoustic decoupler 130 in a manner similar to that shown in FIG. 2A.

An inductor similar to spiral trace 514 described above with reference to FIG. 6 may be defined in the conductive layer of auxiliary substrate 611 and substituted for attachment pads 641 and 643 and surface-mount inductor 613. Additional attachment pads similar to attachment pads 545 and 547 described above with reference to FIG. 7 may additionally be defined in the conductive layer of auxiliary substrate 611. Electrical traces additionally defined in the conductive layer electrically connect a surface-mount or other type of isolating capacitor mounted on the additional attachment pads in series with the inductor between connection pads 682 and 686 to provide DC isolation between electrical circuits 141 and 142 in a manner similar to that described above with reference to FIGS. 3A, 3B and 7.

In an embodiment, gasket 607 is formed of a non-hermetic material coated with a layer of sealing material and interconnection posts 672 and 676 are formed of a non-conductive material coated with a layer of electrically-conductive material as described in U.S. patent application Ser. No. 10/890, 343 of Larson III et al., assigned to the assignee of this disclosure and incorporated herein by reference. The same material or different materials may be used as the non-hermetic material and the non-conductive material. The same material or different materials may be used as the sealing material and the conductive material. In another embodiment, gasket 607 is formed of a material that bonds with silicon as described in U.S. Pat. No. 6,090,687 of Merchant et al., assigned to the assignee of this disclosure and incorporated herein by reference.

FACT 600 is used by mounting it on the printed circuit board of a host electronic device (not shown) and attaching terminal pads 5631–638 to corresponding pads on the printed circuit boards using solder bumps or another suitable attachment process.

An exemplary process for fabricating FACT 600 will now be described. Although the fabrication of a single FACT will be described, the processes to be described are typically applied to wafers in which thousands of devices identical to FACT 600 are formed.

Figure 11A:
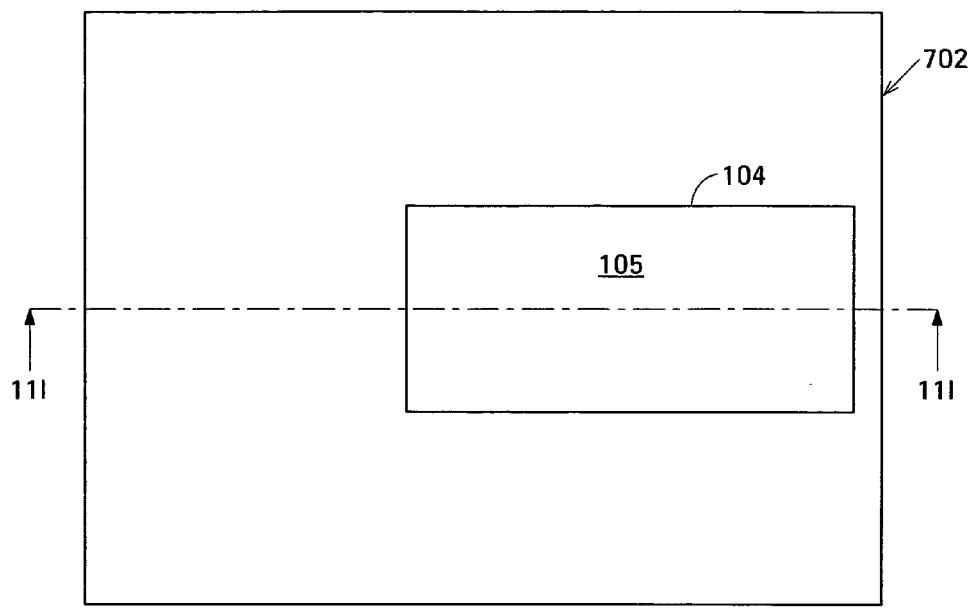
FIGS. 11A–11H are plan views and FIGS. 11I–11P are cross-sectional views along the section lines 11I—11I through 11P—11P in FIGS. 11A–11H, respectively, illustrating a process that may be used to fabricate embodiments of the FACT shown in FIGS. 10A–10B.

FACT module 602 is fabricated using a process similar to that described below with reference to FIGS. 11A–11P, but using different masks. Patterning one of the metal layers, typically the first metal layer, deposited in the course of the FACT module fabrication process additionally defines annular pad 604 on the major surface 609 of substrate 602.

Interconnection posts 672 and 676 and gasket 607 are formed on bonding pads 138 and 178 and annular pad 609, respectively, of substrate 602 by depositing a layer of compliant material, such as polyimide on major surface 609. The layer of compliant material is patterned by photolithography and a developing solvent to define interconnection posts 672 and 676 and gasket 607. The interconnection posts and the gasket are then coated with a coating material. To coat interconnection posts 672 and 676 and gasket 607, a seed layer (e.g., a layer of titanium) is first sputtered onto the substrate and is removed from all but interconnection posts 672 and 676 and gasket 607. Then, interconnection posts 672 and 676 and gasket 607 are electroplated with a relatively thick layer of an electrically-conductive material, such as gold. The coating makes gasket 607 and interconnection posts 672 and 676 electrically conductive and additionally makes gasket 607 impervious to gases such as air and water vapor.

Vias are formed in substrate 602 at locations underlying bonging pads 172, 138, 132, 163, 134, 178, 174 and 168 are formed in substrate 602. Photolithography and anisotropic etching are used, or another suitable fabrication technique is used, to form holes that respectively extend through substrate 602 and, where present, the layers deposited on substrate 602, to the overlying bonding pads. The holes are then filled with conductive material, such as copper or gold. A layer (not shown) of electrically-conducting material, such as gold, is then deposited on the major surface 615 of substrate 602. The layer is patterned to define a terminal pad electrically connected to each of the vias and, hence, to a respective one of connection pads 172, 138, 132, 163, 134, 178, 174 and 168. In an embodiment, gold is deposited by evaporation on major surface 615. The gold is patterned to define the terminal pads. The thickness of the terminal pads is then increased by plating them with additional gold. Terminal pads 631, 632, 636 and 638 are shown in FIGS. 8B and 8C.

A layer of electrically-conducting material (not shown) is deposited on the major surface 617 of auxiliary substrate 611 by a suitable deposition technique. Auxiliary substrate 611 is typically part of a wafer of silicon, ceramic or another material. Ceramic has the advantage of having low electrical losses at microwave frequencies. The electrically-conductive material is typically gold, another electrically-conductive material. The layer of electrically-conducting material may be composed of two or more layers of different materials. Connection pads 682 and 686, attachment pads 641 and 643, electrical traces 661 and 663 and annular pad 619 are defined in the electrically-conducting layer using a suitable process such as photolithography and etching or a lift-off process. The locations and shapes of connection pads 682 and 686 and the location and shape of annular pad 619 on auxiliary substrate 611 respectively correspond to the locations and cross-sectional shapes of interconnection posts 672 and 676 and the location and shape of gasket 607 on substrate 602. However, the shape of connection pads 682 and 686 may differ from the cross-sectional shape of interconnection posts 672 and 676, respectively.

Surface-mount inductor 613 is mounted on attachment pads 641 and 643 using a conventional surface-mount attachment technique. In embodiments such as that shown in FIG. 3A that have a capacitor in series with inductor 613, the capacitor is additionally mounted on its respective attachment pads. In embodiments in which the inductor 180 is embodied as a spiral or serpentine trace defined in the electrically-conductive layer deposited on auxiliary substrate 611, no inductor mounting process is performed.

Auxiliary substrate 611 is inverted and is disposed opposite substrate 602 with annular pad 619 and attachment pads 682 and 686 aligned with gasket 607 and interconnection posts 672 and 676, respectively. Auxiliary substrate 611 is then pressed against and bonded to substrate 602. Pressing the substrates together puts interconnection posts 672 and 676 in contact with connection pads 682 and 686, respectively, and puts gasket 607 in contact with annular pad 619. As the substrates are pressed together, the compliant material of the interconnection posts enables the interconnection posts to deform without fracturing or otherwise failing, and the compliant material of gasket 607 enables the gasket to deform without fracturing or otherwise failing. Typically, substrates 602 and 611 are bonded while being pressed together. Various known or future-developed bonding techniques may be used to bond substrates 602 and 611.

In one embodiment, thermal compression bonding is used. In such embodiment, the electrically conductive material used to coat interconnection posts 672 and 676 and gasket 607 is gold (Au). Before substrates 602 and 611 are bonded, a layer of tin (Sn) is deposited on the gold-coated interconnection posts and gasket. Substrates 602 and 611 are then pressed together until interconnection posts 672 and 676 and gasket 607 make intimate contact with connection pads 682 and 686 and annular pad 619, respectively, and the assembly is heated until the gold and tin coating on the interconnection posts and gasket begins to melt. At this point, the coating material adheres to the material of annular pad 619 and connection pads 682 and 686. The assembly is then allowed to cool. The molten coating material solidifies as the assembly cools, and the solidified material forms a bond between connection pads 682 and 686 and interconnection posts 672 and 676, respectively, and between gasket 607 and annular pad 619. The additional layer of tin on the gold-coated interconnection posts and gasket helps form a stronger bond during the thermal compression bonding.

The compliant materials of interconnection posts 672 and 676 and gasket 607 ensure that interconnection posts 672 and 676 and gasket 607 on substrate 611 intimately contact connection pads 682 and 686 and annular pad 619 on auxiliary substrate 611. The compliant materials of interconnection posts 672 and 676 and gasket 607 allow interconnection posts 672 and 676 and gasket 607 to deform until interconnection posts 672 and 676 form a low-resistance electrical contact with connection pads 682 and 686, respectively, and gasket 607 contacts annular pad 619 along its entire periphery. For example, due to imperfections in the fabrication of interconnection posts 672 and 676 and gasket 607, it is possible for gasket 607 to contact annular pad 619 before either or both of interconnection posts 672 and 676 contact connection pads 682 and 686, respectively. In this instance, gasket 607 deforms to allow the substrates 602 and 611 to be further pressed together until the interconnection posts makes intimate contact with their respective contact pads. Similarly, either or both of interconnection posts 672 and 676 or portions of gasket 607 may deform to allow the entire periphery of the gasket to make intimate physical contact with annular pad 619. Intimate physical contact between the interconnection posts and their respective contact pads and between the gasket and annular pad 619 during bonding helps to ensure that the interconnection posts provides a reliable, low-impedance electrical conduction between electrodes 114 and 112 and inductor 613 and that gasket 607 provides a reliable hermetic seal for the chamber bounded by substrates 602 and 611 and gasket 607.

The above-described process for assembling substrates 602 and 611 for form an hermetically-sealed chamber is described in more detailed in the above-mentioned U.S. patent application Ser. No. 10/890,343, and additionally in commonly-assigned U.S. patent application Ser. No. 10/723,095 of Bai, which is also incorporated herein by reference.

FACT 600 is used by mounting it on the printed circuit board of a host electronic device using the terminal pads, such as terminal pads 631, 632, 636 and 638 on the major surface 615 of substrate 602.

In a practical embodiment of FACT 202 shown in FIG. 2B or of FACT 302 shown in FIG. 3B, an additional interconnection post (not shown) is located on bonding pad 172 to provide an electrical connection to auxiliary substrate 611 from electrode 154. In such embodiment, a connection pad (not shown) corresponding to the additional interconnection post and mounting pads for mounting an additional surface-mount inductor (and an optional additional isolation capacitor) are defined in the conductive layer of auxiliary substrate 611. An additional electrical trace (not shown) connects the other end of the additional inductor to connection pad 686 directly or via the additional isolation capacitor.

Figure 9A:
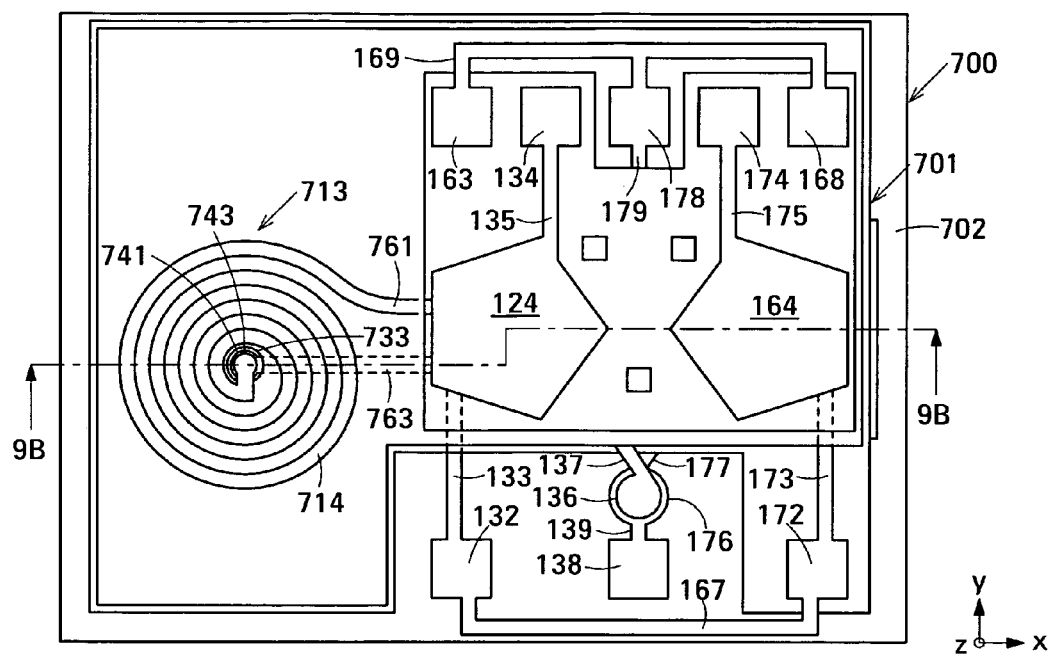
FIGS. 9A and 9B are respectively a plan view and a cross-sectional view along the section line 9B—9B in FIG. 9A of a fifth practical embodiment of a FACT with high CMRR in accordance with the invention.
Figure 9B:
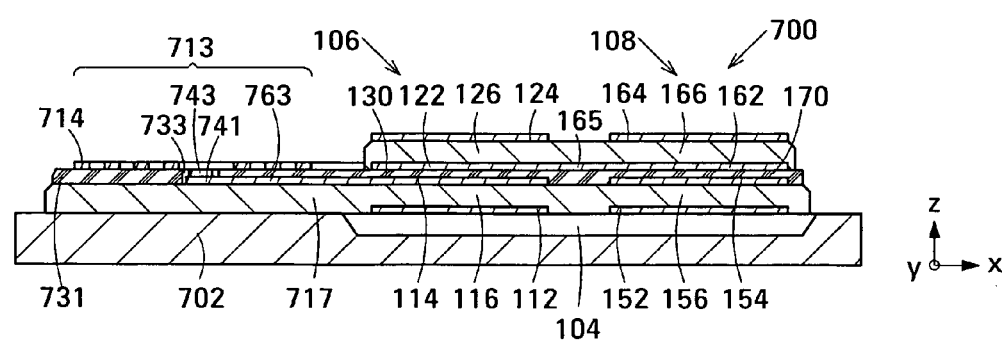

FIGS. 9A and 9B are respectively a plan view and a cross-sectional view along the section line 9B—9B in FIG. 9A of a fifth practical embodiment 700 of a film acoustically-coupled transformer (FACT) with increased CMRR in accordance with the invention. In FACT 700, an inductor is connected between electrodes 114 and 122 in an arrangement similar to that shown in FIG. 2A. The inductor is located on the substrate that forms part of an embodiment of FACT module 400 described above with reference to FIGS. 4A–4C. Elements of FACT 700 that correspond to FACT module 400 described above with reference to FIGS. 4A–4C are indicated using the same reference numerals and will not be described again here.

FACT 700 is composed of an embodiment 701 of FACT module 400 described above with reference to FIGS. 4A–4C. In FACT module 701, substrate 702 is extended in the −x-direction relative to the substrate 102 of the embodiment of FACT module 400. Piezoelectric layer 717 and acoustic decoupling layer 731 additionally extend over the extended portion of substrate 702. Inductor 180 (FIG. 2A) is embodied as a spiral inductor 713 defined in a conductive layer located on the surface of acoustic decoupling layer 731.

An electrical trace 763 extends in the −x-direction over the major surface of piezoelectric layer 717 from electrode 114 to an interconnection pad 741. Acoustic decoupling layer 731 covers trace 763, but a window 733 defined in acoustic decoupling layer 731 provides access to interconnection pad 741. Spiral inductor 713 is structured as a spiral trace 714 located on the surface of acoustic decoupling layer 731. An interconnection pad 743 that electrically contacts interconnection pad 741 through window 733 is located at the inner end of spiral trace 714. An electrical trace 761 extends in the −x-direction over the surface of acoustic decoupling layer 731 from electrode 122 to the outer end of spiral trace 714.

Figure 10A:
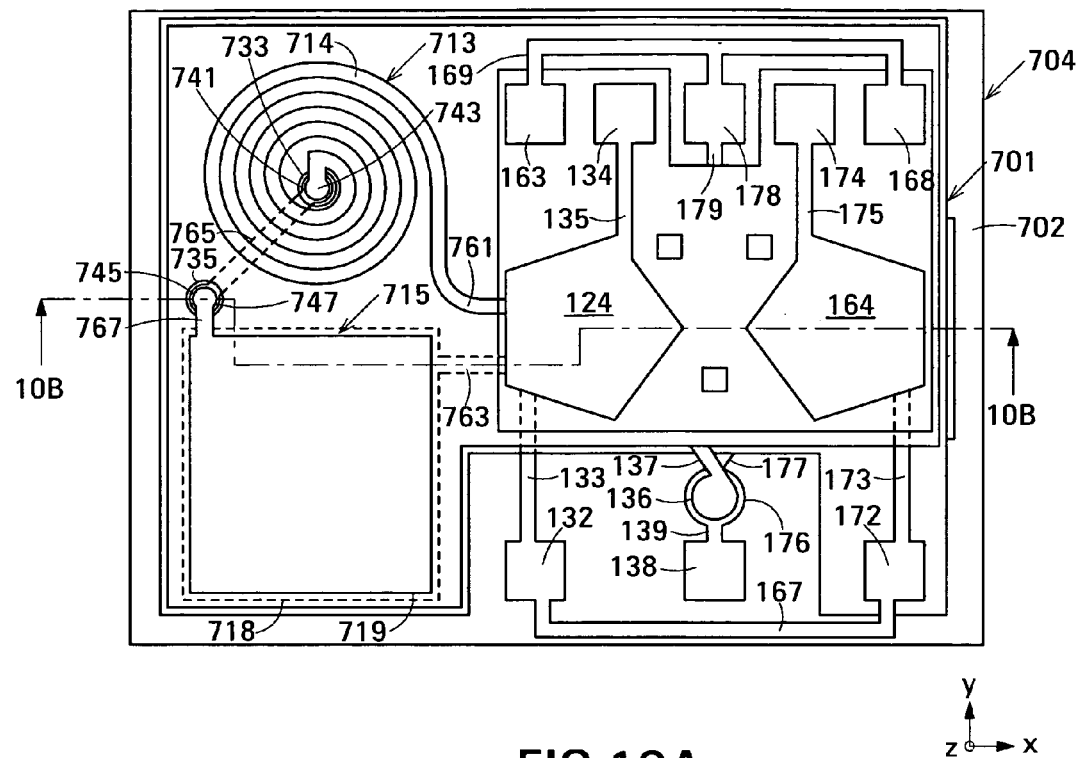
FIGS. 10A and 10B are respectively a plan view and a cross-sectional view along the section line 10B—10B in FIG. 10A of a sixth practical embodiment of a FACT with high CMRR in accordance with the invention that provides DC isolation between primary and secondary.
Figure 10B:
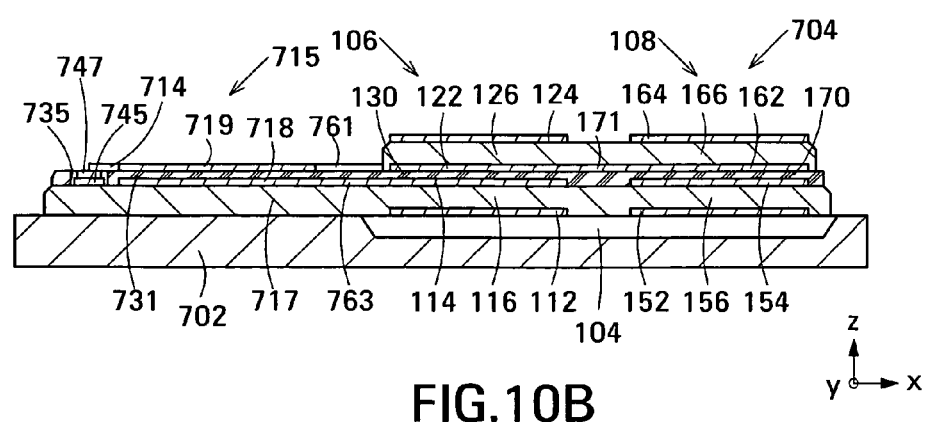

FIGS. 10A and 10B are respectively a plan view and a cross-sectional view along the section line 10B—10B in FIG. 10A of a sixth practical embodiment 704 of a film acoustically-coupled transformer (FACT) with increased CMRR in accordance with the invention. In FACT 704, an inductor and a capacitor are connected in series between electrodes 114 and 122 in an arrangement similar to that shown in FIG. 3A. The capacitor and the inductor are located on the substrate that forms part of an embodiment of FACT module 400 described above with reference to FIGS. 4A–4C. Elements of FACT 700 that correspond to FACT module 400 described above with reference to FIGS. 4A–4C and FACT 700 described above with reference to FIGS. 9A and 9B are indicated using the same reference numerals and will not be described again here.

FACT 704 is composed of the above-described embodiment 701 of FACT module 400 in which substrate 702 is extended in the −x-direction and piezoelectric layer 717 and acoustic decoupling layer 731 extend over the extended portion of substrate 702. Inductor 180 (FIG. 3A) is embodied as a spiral inductor 713 defined in a conductive layer located on the surface of acoustic decoupling layer 731. Capacitor 184 (FIG. 3A) is embodied as a parallel-plate capacitor 715 having part of acoustic decoupling layer 731 as its dielectric.

One plate 718 of parallel-plate capacitor 715 is located on the major surface of piezoelectric layer 717. An electrical trace 763 extends in the −x-direction over the major surface of piezoelectric layer 717 from electrode 114 to plate 718. An electrical trace 765 extends at about 45 degrees to the x-direction over the major surface of piezoelectric layer 717 from an interconnection pad 745 located outside plate 718 to interconnection pad 741 located at the center of spiral inductor 713. Acoustic decoupling layer 731 covers trace 763, trace 765 and plate 718, but window 733 and a window 735 defined in acoustic decoupling layer 731 provide access to interconnection pad 741 and interconnection pad 745, respectively.

The other plate 719 of capacitor 715 and spiral inductor 713 are located on the major surface of acoustic decoupling layer 731. Spiral inductor 713 is structured as spiral trace 714 located on the major surface of acoustic decoupling layer 731. An electrical trace 761 extends on over the surface of acoustic decoupling layer 731 from electrode 122 to the outer end of spiral trace 714. Interconnection pad 743 that electrically contacts interconnection pad 741 through window 733 is located at the inner end of spiral trace 714.

An electrical trace 767 extends in the y-direction over the major surface of acoustic decoupling layer 731 from plate 719 to interconnection pad 747. Interconnection pad 747 electrically contacts interconnection pad 745 through window 735 to complete the series connection of inductor 713 and capacitor 715 between electrodes 114 and 122.

In some embodiments, cavity 104 is extended so that it additionally underlies spiral inductor 713. This increases the separation between the inductor and the material of substrate 702, which reduces electrical losses.

In practical embodiments of the circuits shown in FIGS. 2B and 3B based on the practical embodiments shown in FIGS. 9A, 9B, 10A and 10B, substrate 702, piezoelectric layer 717 and acoustic decoupling layer 731 are additionally extended in the +x-direction (not shown). An additional spiral inductor is located on the additional extension of the substrate in the +x-direction and is connected between electrodes 154 and 162 as shown in FIG. 2B. Alternatively, an additional spiral inductor connected in series with an additional parallel-plate capacitor are located on the additional extension of the substrate in the +x-direction and are connected between electrodes 154 and 162 as shown in FIG. 3B.

A process that can be used to fabricate FACT 704 described above with reference to FIGS. 10A and 10B will be described next with reference to the plan views of FIGS. 11A–11H and the cross-sectional views of FIGS. 11I–11P. The pass band of the embodiment of FACT 704 whose fabrication will be described has a nominal center frequency of about 1.9 GHz. Embodiments for operation at other frequencies are similar in structure and fabrication but will have thicknesses and lateral dimensions different from those exemplified below. Moreover, with different masks, the process may be also be used to fabricate embodiments of the FACT 700 described above with reference to FIGS. 9A and 9B and the various embodiments of the FACT module 400 primarily described above with reference to FIGS. 4A–4C. Thousands of FACTs similar to FACT 704 are fabricated at a time by wafer-scale fabrication. Such wafer-scale fabrication makes the FACTs inexpensive to fabricate.

A wafer of single-crystal silicon is provided. A portion of the wafer constitutes, for each FACT being fabricated, a substrate corresponding to the substrate 702 of FACT 704. FIGS. 11A–11H and FIGS. 11–11P illustrate, and the following description describes, the fabrication of FACT 704 in and on a portion of the wafer. As FACT 704 is fabricated, the other FACTs on the wafer are similarly fabricated.

Figure 11I:
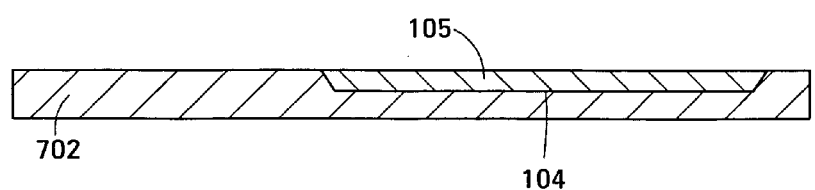

The portion of the wafer that constitutes the substrate 702 of FACT 704 is selectively wet etched to form a cavity. A layer of fill material (not shown) is deposited on the surface of the wafer with a thickness sufficient to fill each cavity. The surface of the wafer is then planarized, leaving each cavity filled with fill material. FIGS. 11A and 11I show cavity 104 in substrate 702 filled with fill material 105.

In an embodiment, the fill material was phosphosilicate glass (PSG) and was deposited using conventional low-pressure chemical vapor deposition (LPCVD). The fill material may alternatively be deposited by sputtering or by spin coating.

Figure 11B:
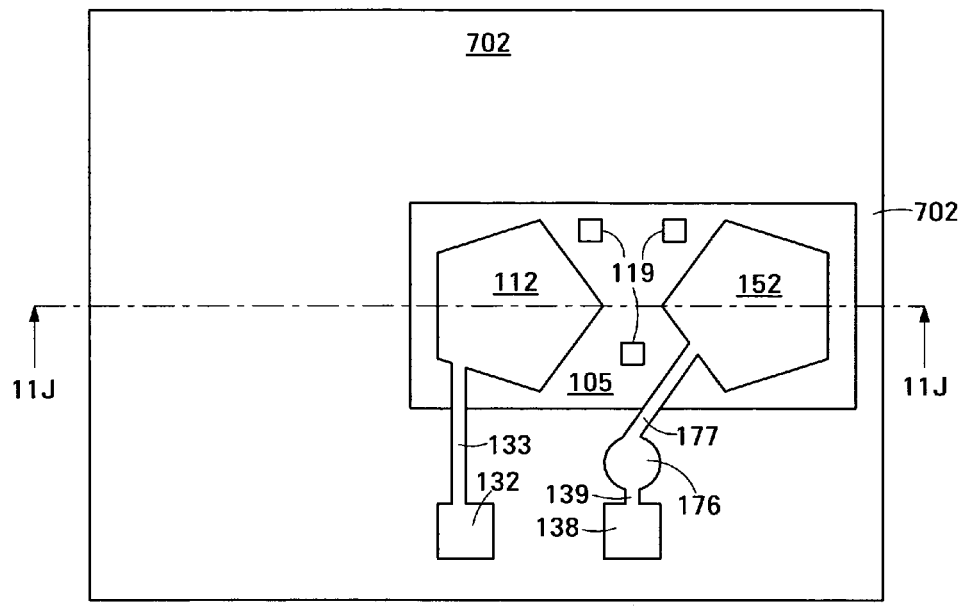
Figure 11J:
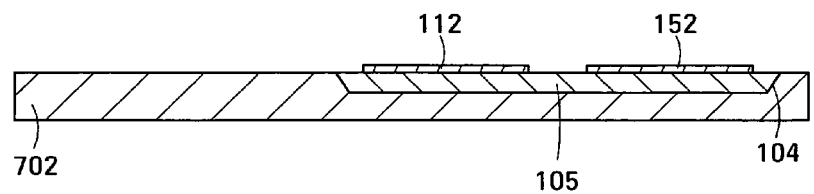

A first metal layer is deposited on the surface of substrate 702 and fill material 105. The first metal layer is patterned as shown in FIGS. 11B and 11J to define electrode 112, electrode 152, bonding pad 132, bonding pad 138 and interconnection pad 176. The patterning also defines in the first metal layer electrical trace 133 extending between electrode 112 and bonding pad 132, electrical trace 177 extending between electrode 152 and interconnection pad 177, and electrical trace 139 extending between interconnection pad 176 and bonding pad 138.

Electrode 112 and electrode 152 typically have an asymmetrical shape in a plane parallel to the major surface of the wafer. An asymmetrical shape minimizes lateral modes in FBAR 110 and FBAR 150 (FIG. 2A) of which the electrodes form part. This is described in U.S. Pat. No. 6,215,375 of Larson III et al., the disclosure of which is incorporated into this disclosure by reference. Electrode 112 and electrode 152 leave part of the surface of fill material 105 exposed so that the fill material can later be removed by etching, as will be described below.

Referring additionally to FIG. 2A, electrodes 114 and 154 are defined in a second metal layer, electrodes 122 and 162 are defined in a third metal layer and electrodes 124 and 164 are defined in a fourth metal layer, as will be described below. The metal layers in which the electrodes are define are patterned such that, in respective planes parallel to the major surface of the wafer, electrodes 112 and 114 of FBAR 110 have the same shape, size, orientation and position, electrodes 122 and 124 of FBAR 120 have the same shape, size, orientation and position, electrodes 152 and 154 of FBAR 150 have the same shape, size, orientation and position and electrodes 162 and 164 of FBAR 160 have the same shape, size, orientation and position. Typically, electrodes 114 and 122 additionally have the same shape, size, orientation and position and electrodes 154 and 162 additionally have the same shape, size, orientation and position.

In an embodiment, the material of each of the metal layers was molybdenum deposited by sputtering to a thickness of about 300 nm. The electrodes defined in each of the metal layers were pentagonal each with an area of about 12,000 square μm. Other electrode areas give other characteristic impedances. Other refractory metals such as tungsten, niobium and titanium may alternatively be used as the material of the metal layers. The metal layers may each alternatively comprise layers of more than one material. One factor to be considered in choosing the material of the electrodes of FACT 704 is the acoustic properties of the electrode material: the acoustic properties of the material(s) of the remaining metal parts of FACT 704 are less important than other properties such as electrical conductivity. Thus, material(s) of the remaining metal parts of FACT 704 may be different from the material of the electrodes.

Figure 11C:
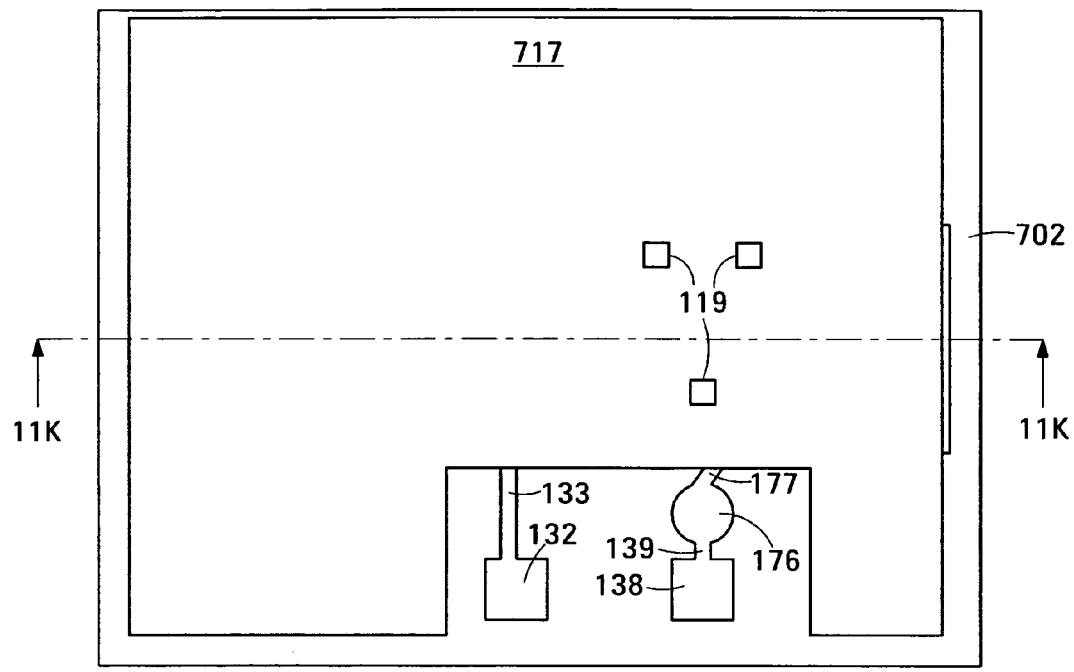
Figure 11K:
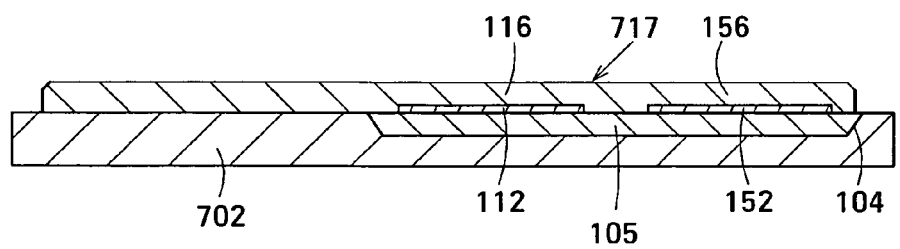

A layer of piezoelectric material is deposited and is patterned as shown in FIGS. 11C and 11K to define a piezoelectric layer 717 that provides piezoelectric element 116 of FBAR 110 and piezoelectric element 156 of FBAR 150. Piezoelectric layer 717 extends over substrate 702 beyond the extent of cavity 104 to provide support for spiral inductor 713 and capacitor 715. Piezoelectric layer 717 is patterned to expose part of the surface of fill material 105, bonding pads 132 and 138 and interconnection pad 176. Piezoelectric layer 717 is additionally patterned to define windows 119 that provide access to additional parts of the surface of the fill material.

In an embodiment, the piezoelectric material deposited to form piezoelectric layer 717 and piezoelectric layer 727 described below was aluminum nitride deposited by sputtering to a thickness of about 1.4 μm. The piezoelectric material was patterned by wet etching in potassium hydroxide or by chlorine-based dry etching. Alternative materials for the piezoelectric layers include zinc oxide, cadmium sulfide and poled ferroelectric materials such as perovskite ferroelectric materials, including lead zirconium titanate, lead meta niobate and barium titanate.

Figure 11D:
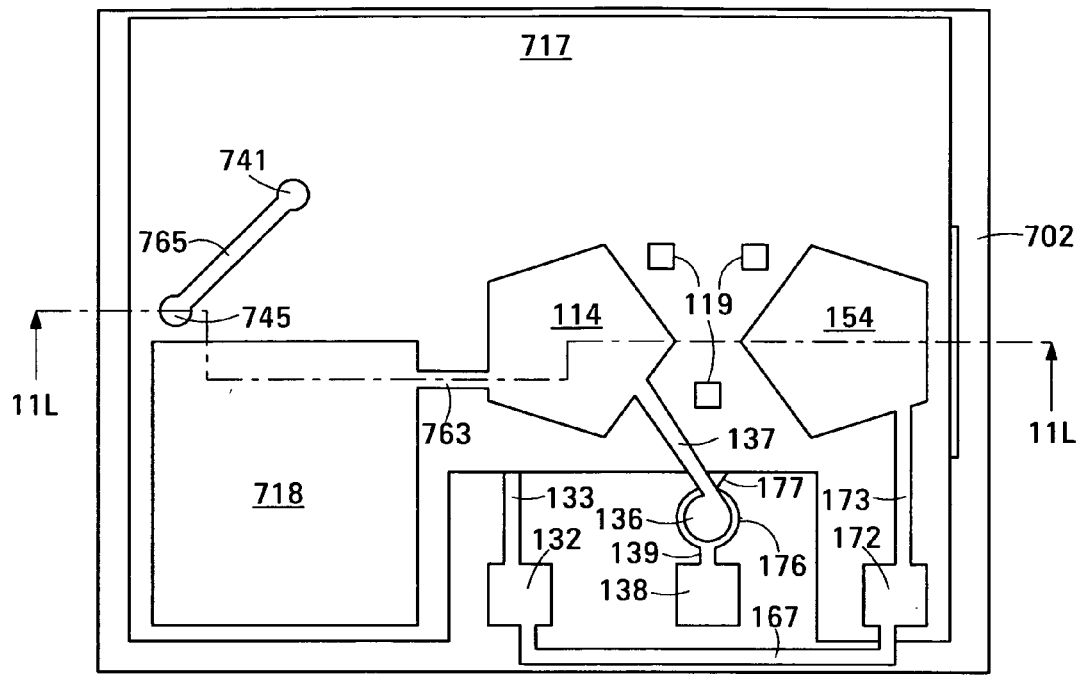
Figure 11L:
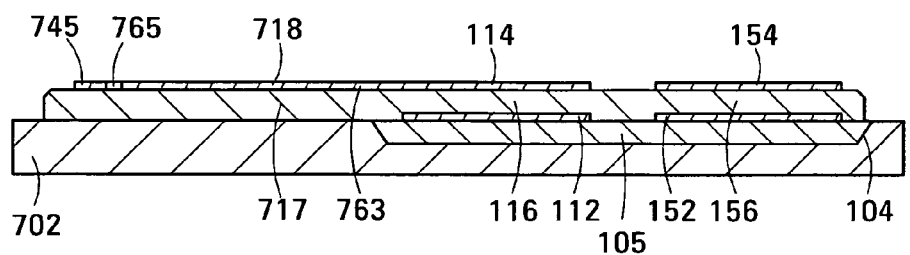

A second metal layer is deposited on piezoelectric layer 717 and is patterned as shown in FIGS. 11D and 11L to define electrode 114, electrode 154, plate 718 of capacitor 715 (FIG. 10A), bonding pad 172, interconnection pad 136 in electrical contact with interconnection pad 176, and interconnection pads 741 and 745. The patterning additionally defines in the second metal layer electrical trace 137 extending between electrode 114 and interconnection pad 136, electrical trace 173 extending between electrode 154 and bonding pad 172, electrical trace 763 extending between electrode 114 and plate 718, electrical trace 765 extending between interconnection pads 741 and 745, and electrical trace 167 extending between bonding pads 132 and 172.

Figure 11E:
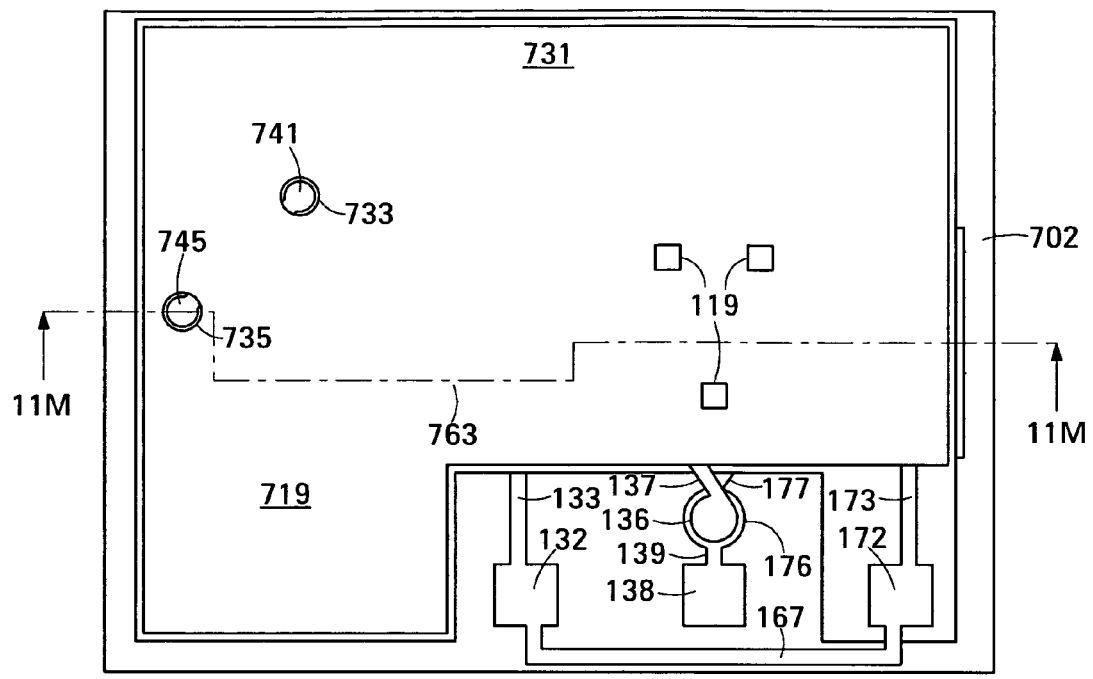
Figure 11M:
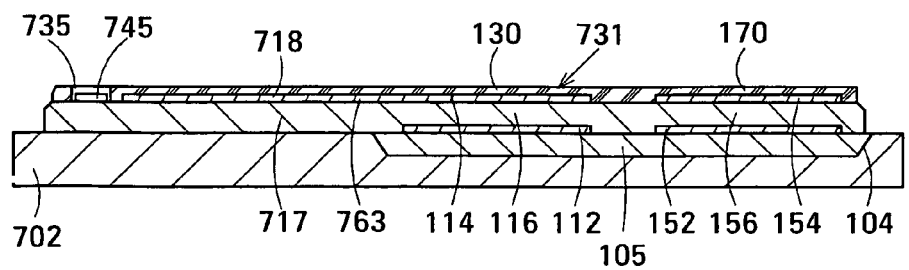

A layer of acoustic decoupling material is then deposited and is patterned as shown in FIGS. 11E and 11M to define acoustic decoupling layer 731 that provides acoustic decoupler 130 and acoustic decoupler 170. Acoustic decoupling layer 731 extends over substrate 702 beyond the extent of cavity 104 to provide the dielectric of capacitor 715 and support for spiral inductor 713. Acoustic decoupling layer 731 is patterned to cover at least electrode 114 and electrode 154, and to expose part of the surface of fill material 105, bonding pads 132, 138 and 172, and interconnection pads 136 and 176. Acoustic decoupling layer 731 is additionally patterned to define windows 119 that provide access to additional parts of the surface of the fill material, and to define windows 733 and 735 that provide access to interconnection pads 741 and 745, respectively.

In an embodiment, the acoustic decoupling material was polyimide with a thickness of about 200 nm, i.e., one quarter of the center frequency wavelength in the polyimide. The polyimide was deposited to form acoustic decoupling layer 731 by spin coating, and was patterned by photolithography. Polyimide is photosensitive so that no photoresist is needed. As noted above, other plastic materials can be used as the acoustic decoupling material. The acoustic decoupling material can be deposited by methods other than spin coating.

In an embodiment in which the acoustic decoupling material was polyimide, after depositing and patterning the polyimide, the wafer was baked initially at a temperature of about 250° C. in air and finally at a temperature of about 415° C. in an inert atmosphere, such as a nitrogen atmosphere, before further processing was performed. The bake evaporates volatile constituents of the polyimide and prevents the evaporation of such volatile constituents during subsequent processing from causing separation of subsequently-deposited layers.

Figure 11F:
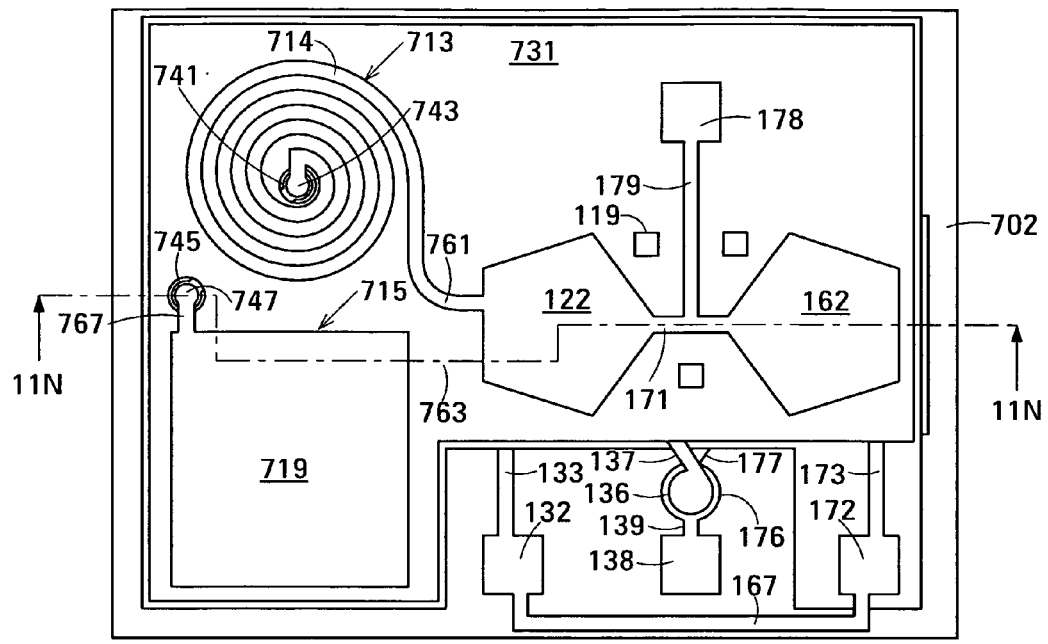
Figure 11N:
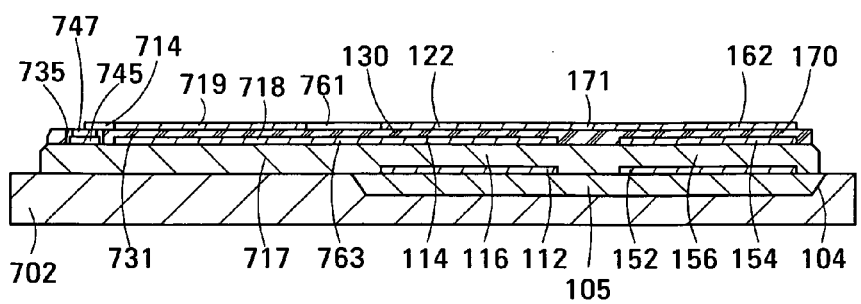

A third metal layer is deposited on acoustic decoupling layer 731 and is patterned as shown in FIGS. 11F and 11N to define electrode 122, electrode 162, spiral trace 714 constituting spiral inductor 713, plate 719 of capacitor 715 (FIG. 10A), bonding pad 178, interconnection pad 743 at the inner end of spiral trace 714 in electrical contact with interconnection pad 741 and interconnection pad 747 in electrical contact with interconnection pad 745. The patterning also defines in the third metal layer electrical trace 171 extending between electrode 122 and electrode 162, electrical trace 179 extending between electrical trace 171 and bonding pad 178, electrical trace 761 extending between electrode 122 and the outer end of spiral trace 714, and electrical trace 767 extending between plate 719 and interconnection pad 747.

Figure 11G:
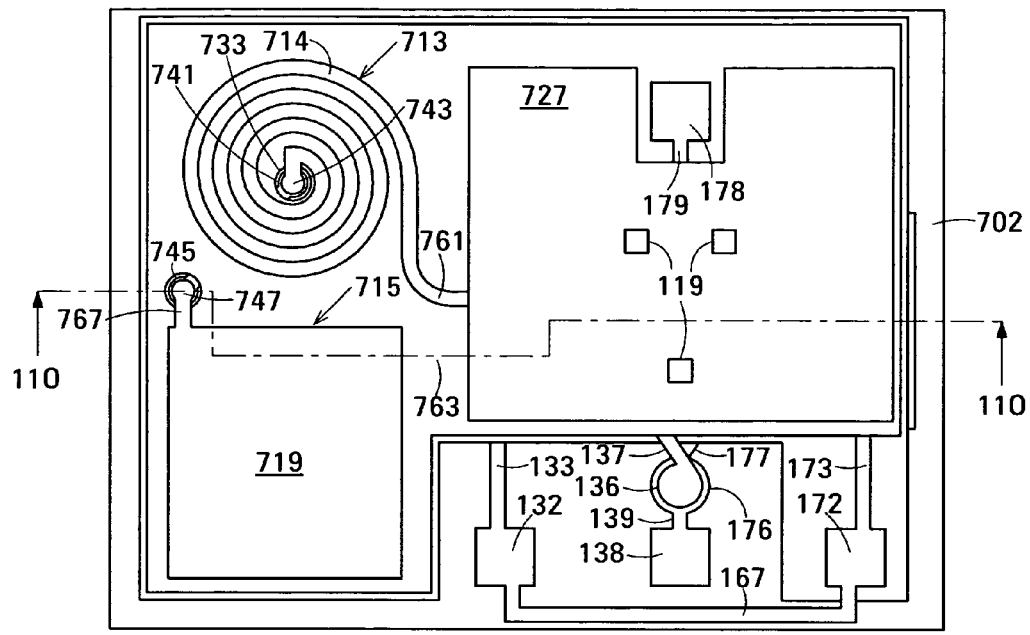
Figure 11O:
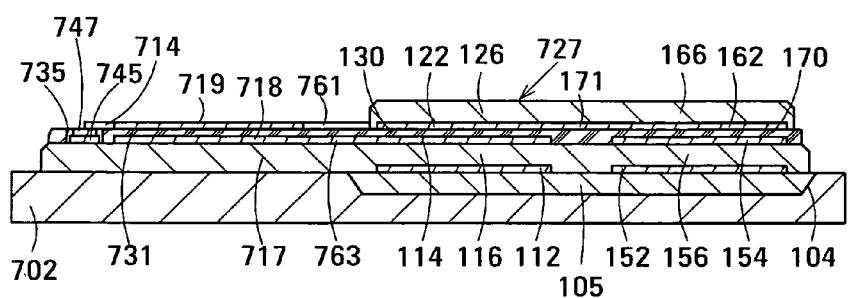

A layer of piezoelectric material is deposited and is patterned as shown in FIGS. 11G and 11O to define piezoelectric layer 727 that provides piezoelectric element 126 of FBAR 120 and piezoelectric element 166 of FBAR 150. Piezoelectric layer 727 is patterned to expose inductor 713, capacitor 715, bonding pads 132, 138, 178 and 172, interconnection pads 136 and 176 and part of the surface of fill material 105. Piezoelectric layer 727 is additionally patterned to define the windows 119 that provide access to additional parts of the surface of the fill material.

Figure 11H:
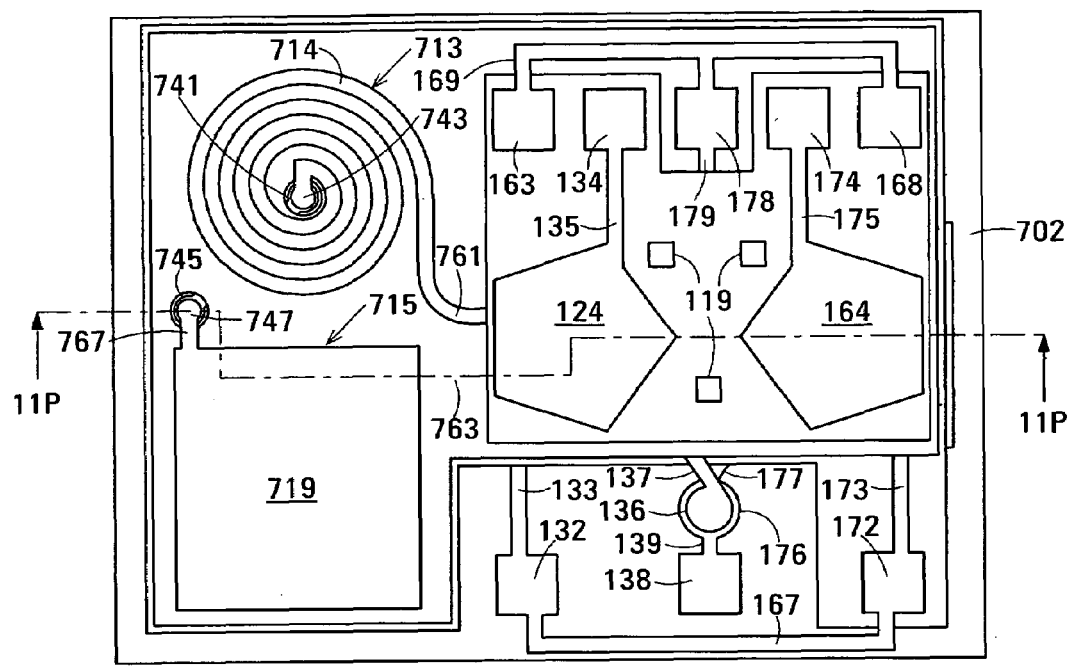
Figure 11P:
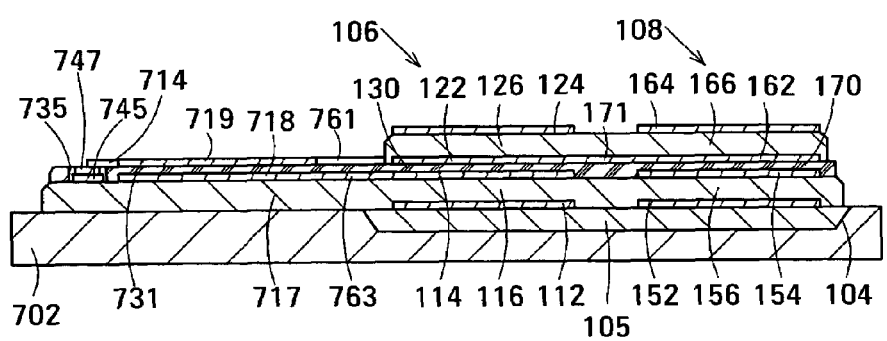

A fourth metal layer is deposited and is patterned as shown in FIGS. 11H and 11P to define electrode 124, electrode 164, bonding pad 163, bonding pad 134, bonding pad 174 and bonding pad 168. The patterning also defines in the fourth metal layer electrical trace 135 extending from electrode 124 to bonding pad 134, electrical trace 175 extending from electrode 164 to bonding pad 174, and electrical trace 169 extending from bonding pad 163 and bonding pad 168 to bonding pad 178.

The wafer is then isotropically wet etched to remove fill material 105 from cavity 104. As noted above, portions of the surface of fill material 105 remain exposed through, for example, windows 119. The etch process leaves FACT 704 suspended over cavity 104, as shown in FIGS. 10A and 10B.

In an embodiment, the etchant used to remove fill material 105 was dilute hydrofluoric acid.

A gold protective layer is deposited on the exposed surfaces of bonding pads 172, 138, 132, 163, 134, 178, 174 and 168.

The wafer is then divided into individual FACTs, including FACT 704. Each FACT is then mounted in a package and electrical connections are made between bonding pads 172, 132, 163, 134, 178, 174 and 168 of the FACT and pads that are part of the package.

In one embodiment, FACT 704 is packaged in a hermetic package similar to that described above with reference to FIGS. 8A–8E. However, components different from inductor 180 and, optionally, capacitor 184 are mounted on the surface of the auxiliary substrate.

In another embodiment, the acoustic decoupling material of acoustic decoupling layer 731 is a crosslinked polyphenylene polymer After the second metal layer is patterned to define electrodes 114 and 154, as described above with reference to FIGS. 11D and 11L, the precursor solution for the crosslinked polyphenylene polymer is spun on in a manner similar to that described above with reference to FIGS. 11E and 11M, but is not patterned. The formulation of the crosslinked polyphenylene polymer and the spin speed are selected so that the crosslinked polyphenylene polymer forms a layer with a thickness of about 187 nm. This corresponds to one quarter of the wavelength $\lambda_n$ in the crosslinked polyphenylene polymer of an acoustic signal equal in frequency equal to the center frequency of the pass band of FACT 704. The wafer is then baked at a temperature in the range from about 385° C. to about 450° C. in an inert ambient, such as under vacuum or in a nitrogen atmosphere, before further processing is performed. The bake first drives off the organic solvents from the precursor solution, and then causes the oligomer to cross link as described above to form the crosslinked polyphenylene polymer.

The third metal layer is then deposited on the layer of crosslinked polyphenylene polymer in a manner similar to that described above with reference to FIG. 11F, but is initially patterned in a manner similar to that shown in FIG. 11E to define a hard mask that will be used to pattern the layer of crosslinked polyphenylene polymer to define acoustic decoupling layer 731. The initially-patterned third metal layer has the same extent as acoustic decoupling layer 731 and has windows in the following locations: over part of the surface of fill material 105, over bonding pads 132, 138 and 172, and in the intended locations of windows 119, 733 and 735 in acoustic decoupling layer 731.

The layer of crosslinked polyphenylene polymer is then patterned as shown in FIG. 11E with the initially-patterned third metal layer as a hard etch mask. The patterning defines the following features in the layer of crosslinked polyphenylene polymer: the extent of acoustic decoupling layer 731, windows that provide access to part of the surface of fill material 105 and to bonding pads 132, 138 and 172, windows 733 and 735 that provide access to interconnection pads 741 and 745, respectively, and windows 119 that provide access to additional parts of the surface of the fill material. The patterning is performed with an oxygen plasma etch.

The third metal layer is then re-patterned as shown in FIGS. 11F and 11N to define electrode 122, electrode 162, spiral trace 714 constituting spiral inductor 713, plate 719 of capacitor 715 (FIG. 10A), bonding pad 178, interconnection pad 743 at the inner end of spiral trace 714 in electrical contact with interconnection pad 741 and interconnection pad 747 in electrical contact with interconnection pad 745. The re-patterning also defines in the third metal layer electrical trace 171 extending between electrode 122 and electrode 162, electrical trace 179 extending between electrical trace 171 and bonding pad 178, electrical trace 761 extending between electrode 122 and the outer end of spiral trace 714, and electrical trace 767 extending between plate 719 and interconnection pad 747.

Fabrication of the embodiment of FACT 704 with an acoustic decoupling layer of crosslinked polyphenylene polymer is completed by performing the processing described above with reference to FIGS. 11G, 11H, 11O and 11P.

In an embodiment, the precursor solution for the crosslinked polyphenylene polymer was one sold by The Dow Chemical Company and designated SiLK™ J. Alternatively, the precursor solution may be any suitable one of the precursor solutions sold by The Dow Chemical Company under the trademark SiLK. In certain embodiments, a layer of an adhesion promoter was deposited before the precursor solution was spun on. Precursor solutions containing oligomers that, when cured, form a crosslinked polyphenylene polymer having an acoustic impedance of about 2 Mrayl may be available from other suppliers now or in the future and may also be used.

This disclosure describes the invention in detail using illustrative embodiments. However, the invention defined by the appended claims is not limited to the precise embodiments described.

We claim:

1. A film acoustically-coupled transformer (FACT), comprising: a first decoupled stacked bulk acoustic resonator (DSBAR) and a second DSBAR, each DSBAR comprising:
   a lower film bulk acoustic resonator (FBAR) and an upper FBAR, the upper FBAR stacked atop the lower FBAR, each FBAR comprising opposed planar electrodes and a piezoelectric element between the electrodes, and
   an acoustic decoupler between the FBARs;
   a first electrical circuit interconnecting the lower FBARs; and
   a second electrical circuit interconnecting the upper FBARs; in which:
   in at least one of the DSBARs, the acoustic decoupler, one of the electrodes of the lower FBAR adjacent the acoustic decoupler and one of the electrodes of the upper FBAR adjacent the acoustic decoupler constitute a parasitic capacitor; and the FACT additionally comprises an inductor electrically connected in parallel with the parasitic capacitor.

2. The FACT of claim 1, in which:
the FACT has a pass band; and
the inductor and the parasitic capacitor constitute part of a parallel resonant circuit having a resonant frequency in the pass band.

3. The FACT of claim 1, in which:
the FACT additionally comprises a substrate arranged to support the DSBARs, the substrate having a major surface; and
the inductor is located over the substrate.

4. The FACT of claim 3, in which:
the substrate comprises a cavity extending into the substrate from the major surface thereof; and
the inductor is suspended over the cavity.

5. The FACT of claim 3, in which the inductor comprises:
a layer of insulating material; and
an inductive element over the layer of insulating material.

6. The FACT of claim 5, in which at least part of the layer of insulating material and the piezoelectric element of one of the FBARs are portions of a common layer.

7. The FACT of claim 5, in which at least part of the layer of insulating material and the acoustic decoupler are portions of a common layer.

8. The FACT of claim 5, in which the layer of insulating material is located on the major surface of the substrate.

9. The FACT of claim 5, in which at least part of the inductive element and one of the electrodes of one of the FBARs of each of the DSBARs are portions of a common layer.

10. The FACT of claim 1, in which:
the FACT additionally comprises:
a substrate supporting the DSBARs, and
a daughter board comprising electrically-conducting traces; and
the substrate and the inductor are mounted on the daughter board electrically interconnected by the conductive traces.

11. The FACT of claim 1, in which:
the FACT additionally comprises a package housing the DSBARs, the package comprising:
a first substrate supporting the DSBARs,
a second substrate disposed parallel to the first substrate, and
a gasket extending between the first substrate and the second substrate; and
the inductor is mounted on the second substrate facing the first substrate.

12. The FACT of claim 11, in which the substrates and the gasket collectively define an hermetic chamber in which the DSBARs and the inductor are located.

13. The FACT of claim 11, in which:
the package additionally comprises an interconnection post extending between the first substrate and the second substrate; and
the inductor is electrically connected to one of the electrodes constituting the parasitic capacitor via the interconnection post.

14. The FACT of claim 1, in which:
the FACT additionally comprises a package, comprising:
a first substrate supporting the DSBARs,
a second substrate disposed parallel to the first substrate, and
a gasket extending between the first substrate and the second substrate; and the inductor is defined in a metal layer located on a surface of the second substrate.

15. The FACT of claim 14, in which:
the package additionally comprises an interconnection post extending between the first substrate and the second substrate; and
the inductor is electrically connected to one of the electrodes of the parasitic capacitor via the interconnection post.

16. The FACT of claim 1, additionally comprising an isolating capacitor electrically connected in series with the inductor.

17. The FACT of claim 16, in which:
the inductor is part of a parallel resonant circuit having a resonant frequency; and
the inductor and the isolating capacitor have a series resonance at a frequency differing from the resonant frequency by more than one octave.

18. The FACT of claim 17, in which:
the isolating capacitor comprises a pair of parallel plates and a dielectric between the parallel plates;
one of the parallel plates and one of the electrodes of the parasitic capacitor are parts of a first conductive common layer;
the other of the parallel plates and the other of the electrodes of the parasitic capacitor are parts of a second common conductive layer; and
the dielectric of the isolating capacitor and the acoustic coupler are parts of a third common layer.

19. The FACT of claim 1, in which:
the FACT has a pass band having a center frequency; and
each of the acoustic decouplers comprises a layer of acoustic decoupling material having a thickness nominally equal to one quarter of the wavelength in the acoustic decoupling material of an acoustic signal equal in frequency to the center frequency.

20. The FACT of claim 1, in which the acoustic decoupling material comprises one of polyimide, parylene and crosslinked polyphenylene polymer.

21. A film acoustically-coupled transformer (FACT) having a pass band, the FACT comprising:
a first decoupled stacked bulk acoustic resonator (DSBAR) and a second DSBAR, each DSBAR comprising:
a lower film bulk acoustic resonator (FBAR) and an upper FBAR, the upper FBAR stacked atop the lower FBAR, each FBAR comprising opposed planar electrodes and a piezoelectric element between the electrodes, and
an acoustic decoupler between the FBARs,
a first electrical circuit interconnecting the lower FBARs; and
a second electrical circuit interconnecting the upper FBARs; in which:
in at least one of the DSBARs, the acoustic decoupler, one of the electrodes of the lower FBAR adjacent the acoustic decoupler and one of the electrodes of the upper FBAR adjacent the acoustic decoupler constitute a parasitic capacitor; and
the FACT additionally comprises means for forming with the parasitic capacitor a parallel resonant circuit having a resonant frequency in the pass band.

22. The FACT of claim 21, in which the means for forming comprises an inductor and an electrical circuit electrically connecting the parasitic capacitor to the inductor.

* * * * *